(12) United States Patent
Awano

(10) Patent No.: US 10,716,248 B2
(45) Date of Patent: Jul. 14, 2020

(54) COMPONENT SUPPLY DEVICE

(71) Applicant: YAMAHA HATSUDOKI KABUSHIKI KAISHA, Iwata-shi, Shizuoka-ken (JP)

(72) Inventor: Yukinari Awano, Shizuoka (JP)

(73) Assignee: YAMAHA HATSUDOKI KABUSHIKI KAISHA, Iwata-shi, Shizouka-ken (JP)

( * ) Notice: Subject to any disclaimer, the term of this patent is extended or adjusted under 35 U.S.C. 154(b) by 0 days.

(21) Appl. No.: 16/341,013

(22) PCT Filed: Oct. 14, 2016

(86) PCT No.: PCT/JP2016/080618
§ 371 (c)(1),
(2) Date: Apr. 10, 2019

(87) PCT Pub. No.: WO2018/070047
PCT Pub. Date: Apr. 19, 2018

(65) Prior Publication Data
US 2019/0230829 A1 Jul. 25, 2019

(51) Int. Cl.
*B32B 43/00* (2006.01)
*H05K 13/02* (2006.01)
(Continued)

(52) U.S. Cl.
CPC ......... *H05K 13/02* (2013.01); *H05K 13/0452* (2013.01); *B32B 38/10* (2013.01);
(Continued)

(58) Field of Classification Search
CPC . B32B 38/10; B32B 43/006; Y10T 156/1184; Y10T 156/1195; Y10T 156/1967; Y10T 156/1994
(Continued)

(56) References Cited

U.S. PATENT DOCUMENTS 4,768,915 A * 9/1988 Fujioka .............. H05K 13/0419
414/416.08
5,588,614 A 12/1996 Takada et al.
(Continued)

FOREIGN PATENT DOCUMENTS

JP H08023190 A 1/1996
JP H11233993 A 8/1999
(Continued)

OTHER PUBLICATIONS

International Search Report issued in PCT/JP2016/080618; dated Jan. 10, 2017.

*Primary Examiner* — Mark A Osele
*Assistant Examiner* — Nickolas R Harm
(74) *Attorney, Agent, or Firm* — Studebaker & Brackett PC

(57) ABSTRACT

A component supply device is a device for supplying components housed in a component storage tape to a component extraction position. The component storage tape traveling toward a component exposure part is guided by a tape guide. This tape guide includes a guide body, and first and second positioning guide members. In the tape guide, the guide body includes a pair of side wall parts that defines a fourth tape traveling path wider than a maximum allowable width of the component storage tape. In the tape guide, the first and second positioning guide members and include first and second bent parts respectively that function as a pair of tape side surface guide parts that guides side surfaces of the component storage tape. The first and second bent parts are apart from each other at a distance shorter than a width of the fourth tape traveling path.

5 Claims, 17 Drawing Sheets

(51) Int. Cl.
*H05K 13/04* (2006.01)
*B32B 38/10* (2006.01)

(52) U.S. Cl.
CPC ........ *B32B 43/006* (2013.01); *Y10T 156/1184* (2015.01); *Y10T 156/1195* (2015.01); *Y10T 156/1967* (2015.01); *Y10T 156/1994* (2015.01)

(58) Field of Classification Search
USPC .............................. 156/717, 719, 762, 767
See application file for complete search history.

(56) References Cited

U.S. PATENT DOCUMENTS

| | | | |
|---|---|---|---|
| 8,489,220 B2 * | 7/2013 | Song .................. | H05K 13/0417 226/112 |
| 2014/0151490 A1 * | 6/2014 | Kobayashi ............. | H05K 13/02 242/522 |
| 2014/0318713 A1 * | 10/2014 | Wiley .................. | B32B 43/006 156/701 |

FOREIGN PATENT DOCUMENTS

| JP | 2009164541 A | 7/2009 |
|---|---|---|
| JP | 2012038760 A | 2/2012 |
| JP | 2015103664 A | 6/2015 |

* cited by examiner

COMPONENT SUPPLY DEVICE

CROSS-REFERENCE TO RELATED APPLICATION

This application is a National Stage of International Patent Application No. PCT/JP2016/080618, filed Oct. 14, 2016, the entire content of which is incorporated herein by reference.

BACKGROUND

Technical Field

The present disclosure relates to a component supply device that supplies components housed in a component storage tape to a component extraction position.

Background Art

A component mounter for mounting electronic components (hereinafter simply referred to as "components") on a board such as a printed wiring board includes a component supply device that supplies the components to a component extraction position. As the component supply device, a device using a component storage tape in which components are housed is known. The component storage tape includes a carrier tape having component storage parts that houses components, and a cover tape affixed on the carrier tape so as to cover the component storage parts. This kind of component supply device is disclosed in Japanese Patent Application Laid-Open No. 2015-103664, for example.

The component supply device disclosed in Japanese Patent Application Laid-Open No. 2015-103664 described above includes a tape feeding mechanism for delivering a component storage tape in a predetermined tape feeding direction, and a component exposure part (top tape exfoliation part). In this component supply device, when the component storage tape that is delivered by the tape feeding mechanism and travels a tape traveling path reaches the component exposure part, the components are extractably exposed by the component exposure part in the component storage parts of the component storage tape.

SUMMARY

Meanwhile, the component storage tape is manufactured such that its width size is within a predetermined tolerance. Therefore, for the width of the component storage tape, an allowable width according to the tolerance is set. In the component supply device, a width of a tape traveling path the component storage tape travels is set to be wider than the maximum allowable width of the component storage tape to allow the component storage tape within the allowable width to travel.

When the width of the tape traveling path is set to be wider than the maximum allowable width of the component storage tape, the component storage tape that travels the tape traveling path is allowed to be displaced in a width direction of the tape traveling path. Therefore, the component storage tape passes a component exposure part with insufficient positioning on the component exposure part in the width direction of the tape traveling path. As a result, there is a possibility that poor component exposure may occur in the component storage parts of the component storage tape, and there is a possibility that component supply efficiency to the component extraction position by the component supply device may be degraded.

The present disclosure has been made in view of such circumstances, and provides a component supply device that can supply components efficiently, the component supply device supplying the components housed in the component storage tape to the component extraction position.

A component supply device according to one aspect of the present disclosure is a device for supplying components to a component extraction position by using a component storage tape including a carrier tape in which a plurality of component storage parts for housing the components are arranged at predetermined intervals, and a cover tape affixed on the carrier tape so as to cover the component storage parts. The component supply device includes a device body; a tape delivery unit disposed in the device body, the tape delivery unit being configured to deliver the component storage tape toward the component extraction position in a tape feeding direction along an arrangement direction of the component storage parts; a tape guide attached to the device body, the tape guide being configured to guide traveling of the component storage tape delivered by the tape delivery unit; and a component exposure part configured to expose the components in the component storage parts of the component storage tape traveling by being guided by the tape guide. The tape guide includes a guide body including a pair of side wall parts extending along the tape feeding direction, the pair of side wall parts being configured to define a tape traveling path wider than a maximum allowable width of the component storage tape; and a positioning guide member including a pair of tape side surface guide parts disposed on an upstream side in the tape feeding direction with respect to the component exposure part on the tape traveling path, the pair of tape side surface guide parts being configured to guide side surfaces of the component storage tape. The pair of tape side surface guide parts is apart from each other at a distance shorter than a width of the tape traveling path in the width direction, and the pair of tape side surface guide parts guides the component storage tape so as to travel toward the component exposure part with positioning performed in the width direction of the tape traveling path.

The object, feature, and advantage of the present disclosure will be more apparent from the following detailed description and the accompanying drawings.

DETAILED DESCRIPTION

A component supply device according to an embodiment of the present disclosure will be described below with reference to the drawings. Note that the following will describe a direction relationship by using XYZ rectangular coordinate axes. An X direction corresponds to a left and right direction (+X is right and −X is left), a Y direction corresponds to a front and rear direction (+Y is front and −Y is rear), and a Z direction corresponds to an up and down direction (+Z is up and −Z is down).

[Overall Configuration of Component Mounter]

Figure 1:
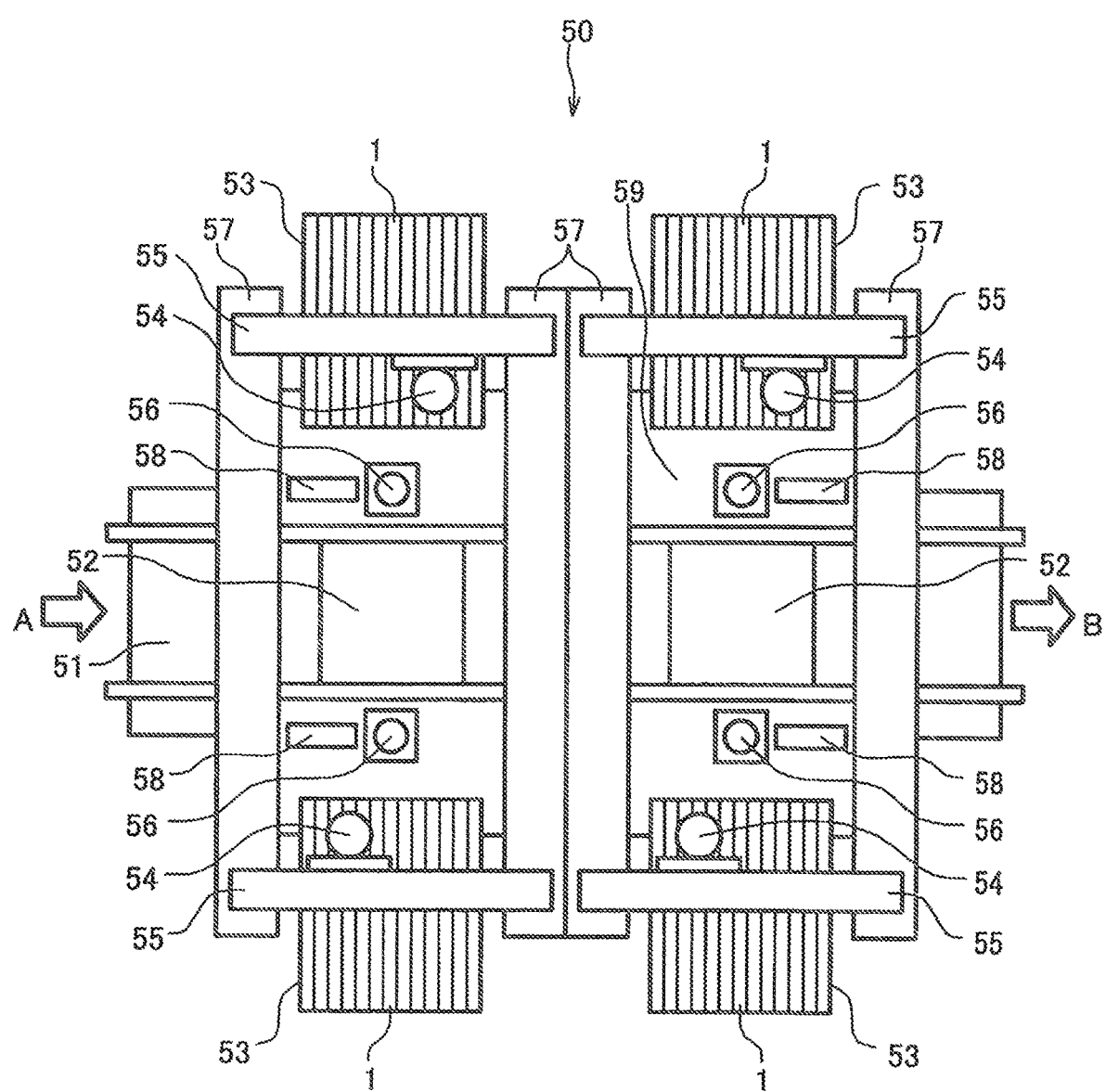
FIG. 1 is a plan view showing a configuration of a component mounter to which a component supply device according to one embodiment of the present disclosure is applied.

FIG. 1 is a plan view showing a configuration of a component mounter 50 to which a component supply device 1 according to one embodiment of the present disclosure is applied. The component mounter 50 is a device that mounts components on a board 52 and produces an electronic circuit board.

Specifically, the component mounter 50 automatically mounts (installs) components at predetermined positions (places where cream solder is applied) of the board 52 conveyed by a board conveyor 51. Circuit patterns such as copper foil are formed by etching, printing, or the like on the board 52 made of an epoxy resin or the like.

The board 52 with components mounted on the cream solder is heated inside an unillustrated furnace in a downstream process. Accordingly, the components are soldered to the board 52, and an electronic circuit board on which the components are mounted is manufactured.

A pair of component supply units 53 is provided facing on both sides with the board conveyor 51 interposed therebetween on a base 59 of the component mounter 50. FIG. 1 shows a case where two sets of the pair of component supply units 53 (for two stages) are installed along a conveyance direction of the board 52.

After the components are mounted on the board 52 conveyed from a direction of arrow A, the board conveyor 51 conveys the board 52 in a direction of arrow B. A plurality of component supply devices 1 are arranged along the conveyance direction of the board 52 and are fixedly installed detachably in the component supply units 53. The component supply devices 1 supply various components to respective component extraction positions (component adsorption positions). These component supply devices 1 are installed side by side adjacent to each other with almost no gap. When a component is supplied to the component extraction position by the component supply device 1, the component is sucked and taken out by being vacuumed by nozzles of a component mounting head 54.

In addition, as shown in FIG. 1, a pair of X beams 55 extending along the direction in which the board 52 is conveyed (direction of arrows A and B) is disposed facing on both sides with the board conveyor 51 interposed therebetween. The pair of X beams 55 is positioned above the board conveyor 51. Unillustrated actuators are attached to both ends of the X beam 55. These actuators support the X beam 55 movably along a Y beam 57 in a direction (up and down direction) orthogonal to the direction in which the board 52 is conveyed (direction of arrows A and B). Therefore, the X beam 55 can reciprocate between the component supply unit 53 and the board 52.

The component mounting head 54 that is moved by an unillustrated actuator along a longitudinal direction (extending direction) of the X beam 55 is installed in the X beam 55. A plurality of nozzles for sucking the component supplied to the component extraction position by the component supply device 1 is provided at a tip of the component mounting head 54. Note that instead of the nozzles, a configuration may be used that provides a chuck for gripping the component at the tip of the component mounting head 54. Furthermore, the component mounting head 54 is moved by the actuator of the X beam 55 along an extending direction of the Y beam 57.

In this way, the component mounting head 54 moves horizontally. Therefore, the component supplied from the component supply device 1 installed in the component supply unit 53 is sucked by the nozzles of the component mounting head 54, and then moves horizontally and is conveyed to a predetermined position on the board 52 for mounting (mounting position). Then, after the component is pressed by the component mounting head 54 at the predetermined position on the board 52 for mounting (place where cream solder is applied), the vacuum of the nozzles is released. This allows the component to be mounted (installed) on the board 52.

A recognition camera 56 and a nozzle storage unit 58 are disposed between the component supply unit 53 and the board conveyor 51. The recognition camera 56 is, for example, a charge coupled device (CCD) camera, and acquires misalignment information on the component sucked by the component mounting head 54. The recognition camera 56 confirms how far the component is misaligned in the board conveyance direction (direction of arrows A and B) and the direction orthogonal to the board conveyance direction, and the degree of a rotation angle, by capturing an image of the component sucked by the component mounting head 54. Needless to say, through capturing the image with the recognition camera 56, it is also possible to confirm whether the component is sucked by the component mounting head 54. When the component mounting head 54 moves above the board 52 in the direction in which the X beam 55 extends or direction in which the Y beam 57 extends from the component supply unit 53, the component mounting head 54 passes above the recognition camera 56. At this time, the recognition camera 56 acquires the misalignment information on the component and the like.

The nozzle storage unit 58 stores the plurality of nozzles to be attached to the component mounting head 54, necessary for sucking various components. For example, when it is instructed to switch to a nozzle corresponding to a specified component, the component mounting head 54 moves to the nozzle storage unit 58 by moving independently in the directions in which the X beam 55 extends and the Y beam 57 extends. Then, the nozzle attached to the component mounting head 54 is replaced with the specified nozzle stored in the nozzle storage unit 58.

[Configuration of Component Supply Device]

Figure 2:
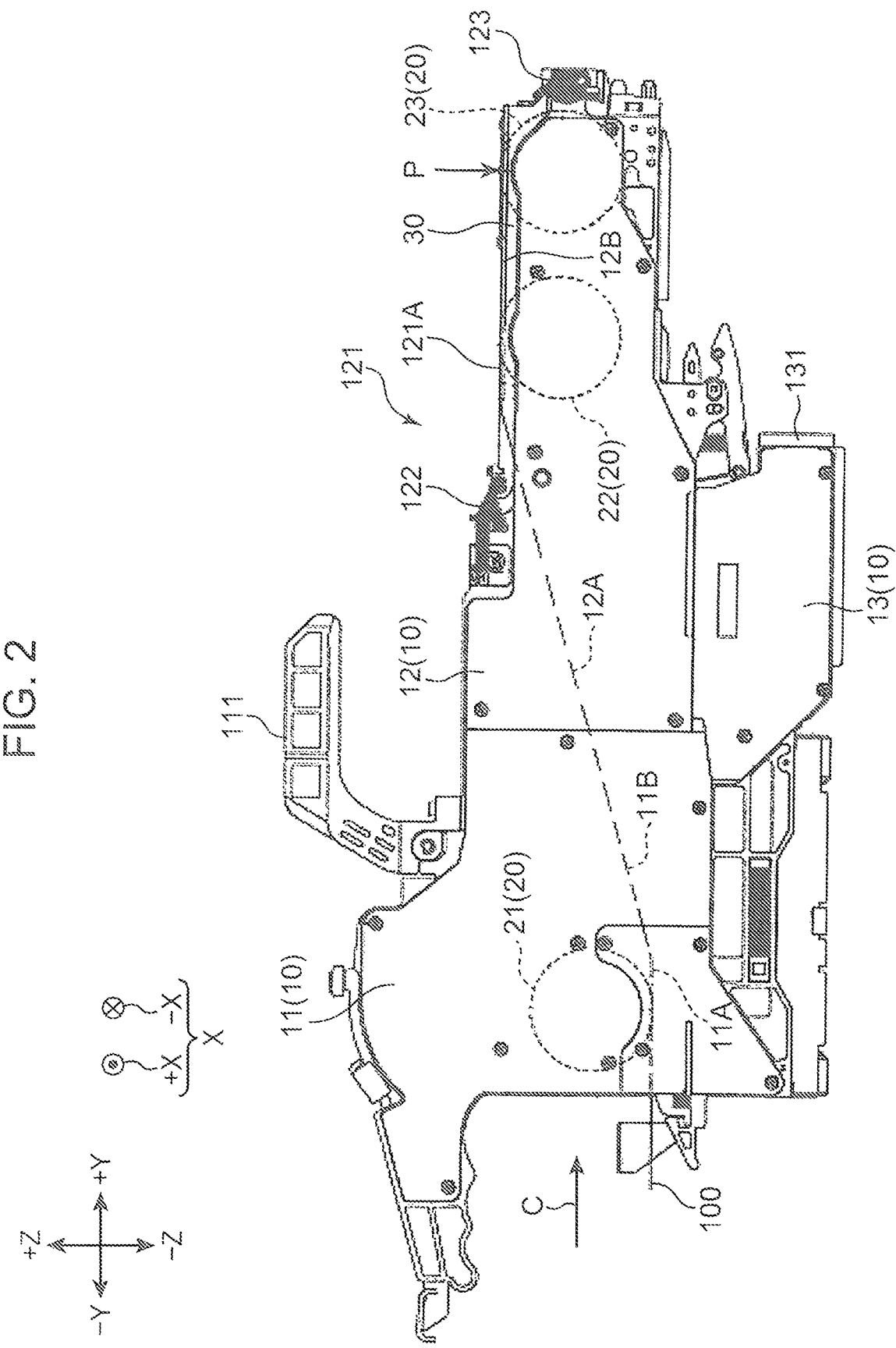
FIG. 2 is a diagram schematically showing an overall configuration of the component supply device.
Figure 3:
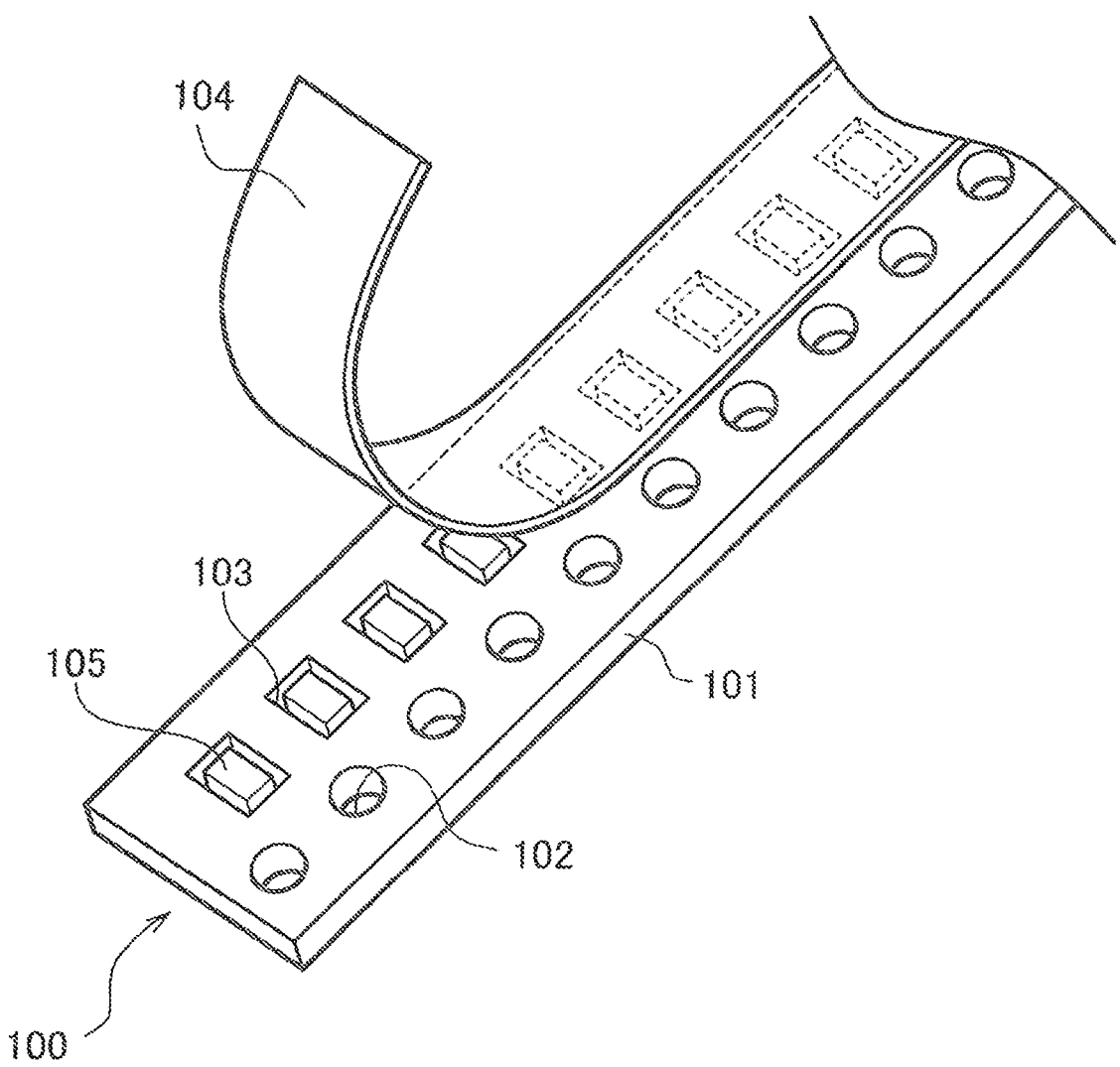
FIG. 3 is a perspective view showing a configuration of a component storage tape used for the component supply device.

FIG. 2 is a diagram schematically showing an overall configuration of the component supply device 1. The component supply device 1 is a device for supplying components housed in a component storage tape to a component extraction position P. Before describing the configuration of the component supply device 1, the component storage tape will be described with reference to FIG. 3. FIG. 3 is a perspective view showing a configuration of a component storage tape 100 used for the component supply device 1.

The component storage tape 100 includes a carrier tape 101 and a cover tape 104. The carrier tape 101 is a tape in which a plurality of component storage parts 103 that house components 105 are arranged at predetermined intervals. In the carrier tape 101, conveyance force transfer holes 102 are arranged at predetermined intervals in one end in its width direction (+X side end). Teeth of a first sprocket 211, a second sprocket 221, and a third sprocket 231 in a tape delivery unit 20 to be described later fit into the conveyance force transfer holes 102. Conveyance force for delivering the component storage tape 100 by the tape delivery unit 20 is transmitted to the conveyance force transfer holes 102. The cover tape 104 is a tape affixed on the carrier tape 101 so as to cover the component storage parts 103.

As shown in FIG. 2, the component supply device 1 includes a device body 10, the tape delivery unit 20, and a tape guide 30.

The device body 10 constitutes an outline of the component supply device 1, and includes a first accommodation case 11, a second accommodation case 12, and a third accommodation case 13. The first accommodation case 11 is disposed on a −Y side of a Y direction (front and rear direction) in the device body 10, and is made of a box with a thin width. Within this first accommodation case 11 are formed a first tape traveling path 11A that extends horizontally in the Y direction (front and rear direction) and a second tape traveling path 11B that extends with an inclination on a +Z side (upper side) from a +Y side (front side) end of the first tape traveling path 11A. The component storage tape 100 is taken into the component supply device 1 from the first tape traveling path 11A of the first accommodation case 11, travels the first tape traveling path 11A, and then travels the second tape traveling path 11B. In addition, a grip part 111 used for carrying the component supply device 1 is provided on an upper surface of the first accommodation case 11.

The second accommodation case 12 is coupled to the +Y side (front side) end of the first accommodation case 11, and is made of a box of the same width as the first accommodation case 11. Within this second accommodation case 12 is formed a third tape traveling path 12A that extends with an inclination on the +Z side (upper side) as in the second tape traveling path 11B from the +Y side (front side) end of the second tape traveling path 11B and reaches an upper surface 121A of the second accommodation case 12. The upper surface 121A of the second accommodation case 12 extends horizontally on the +Y side (front side) along the Y direction (front and rear direction) from the +Y side (front side) end of the third tape traveling path 12A, and defines a fourth tape traveling path 12B. The component extraction position P is set at the +Y side (front side) end of the fourth tape traveling path 12B. The component storage tape 100 travels the first tape traveling path 11A and the second tape traveling path 11B, and then travels in order of the third tape traveling path 12A and the fourth tape traveling path 12B, and reaches the component extraction position P. Note that widths of the first tape traveling path 11A, the second tape traveling path 11B, the third tape traveling path 12A, and the fourth tape traveling path 12B are set as the same value.

An area where the upper surface 121A that defines the fourth tape traveling path 12B is disposed in the second accommodation case 12 is a tape guide installation area 121 to which the tape guide 30 to be described later is attached. In other words, the tape guide installation area 121 includes the upper surface 121A that defines the fourth tape traveling path 12B. Also, in the second accommodation case 12, a first holding unit 122 and a second holding unit 123 for holding the tape guide 30 attached to the tape guide installation area 121 are provided in the tape guide installation area 121. The first holding unit 122 holds a −Y side (rear side) of the tape guide 30, and the second holding unit 123 holds the +Y side (front side) of the tape guide 30.

The third accommodation case 13 is coupled to a −Z side (lower side) end of the second accommodation case 12, and is made of a box of the same width as the second accommodation case 12. This third accommodation case 13 accommodates a control board and the like for controlling an operation of the component supply device 1. A connector 131 is attached to a +Y side (front side) end of the third accommodation case 13. Power supply and various control signals are input into this connector 131 from the component mounter 50.

Figure 4:
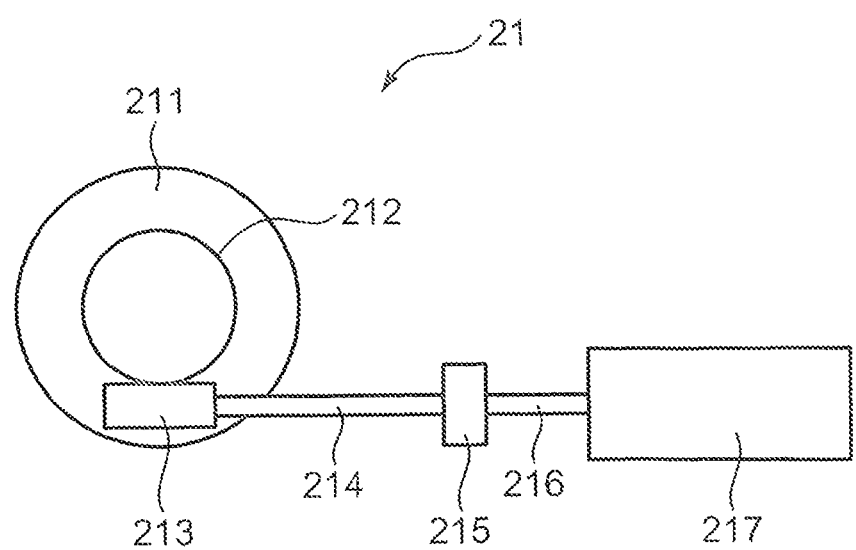
FIG. 4 is a diagram showing a configuration of a first delivery unit of a tape delivery unit included in the component supply device.
Figure 5:
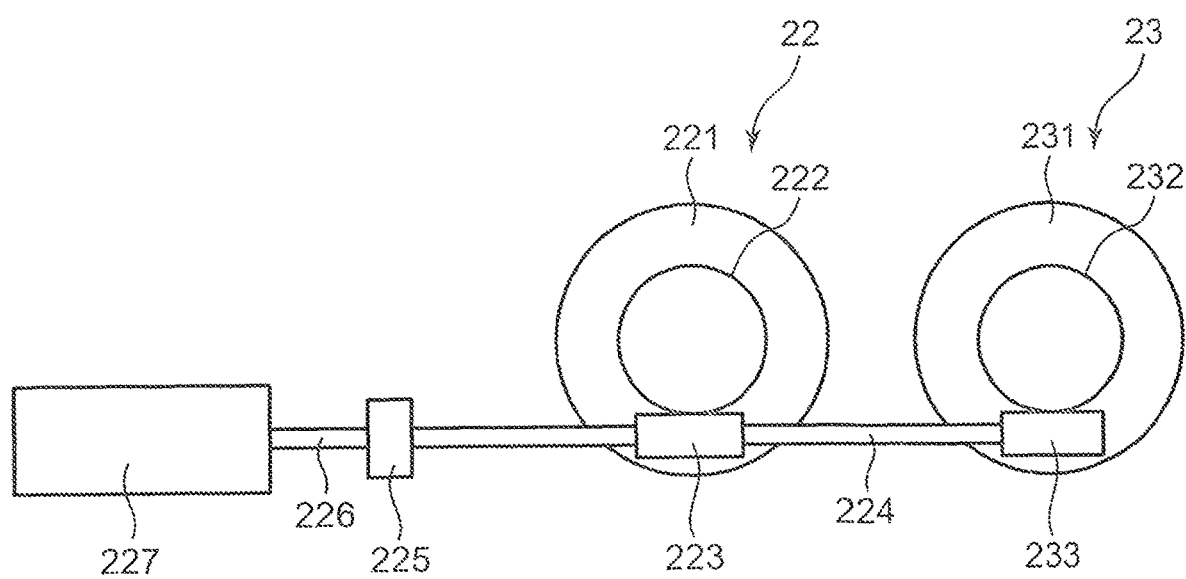
FIG. 5 is a diagram showing a configuration of second and third delivery units of the tape delivery unit included in the component supply device.

The tape delivery unit 20 is disposed in the device body 10, and delivers the component storage tape 100 in a tape feeding direction C along an arrangement direction of the component storage parts 103 toward the component extraction position P. Note that the tape feeding direction C is a direction to go from the −Y side (rear side) to the +Y side (front side) of the Y direction (front and rear direction). The tape delivery unit 20 includes, as shown in FIG. 2, a first delivery unit 21, a second delivery unit 22, and a third delivery unit 23. These first to third delivery units 21, 22, and 23 will be described with reference to FIGS. 4 and 5. FIG. 4 is a diagram showing a configuration of the first delivery unit 21 of the tape delivery unit 20 included in the component supply device 1. FIG. 5 is a diagram showing a configuration of the second and third delivery units 22 and 23 of the tape delivery unit 20 included in the component supply device 1.

The first delivery unit 21 is disposed at a −Y side (rear side) end within the first accommodation case 11 of the device body 10. The first delivery unit 21 causes the component storage tape 100 to travel in order of the first tape traveling path 11A, the second tape traveling path 11B, and the third tape traveling path 12A by delivering the component storage tape 100 with a tip as a free end. The first delivery unit 21 includes the first sprocket 211, a first worm wheel 212, a first worm 213, a first shaft 214, a first gear mechanism 215, a first motor shaft 216, and a first motor 217.

The first sprocket 211 is a disk-shaped sprocket supported rotatably about an axis extending in the X direction (left and right direction) within the first accommodation case 11. The first sprocket 211 includes a plurality of teeth arranged at predetermined intervals in a circumferential direction. The teeth of the first sprocket 211 can fit into the conveyance force transfer holes 102 formed in the carrier tape 101 of the component storage tape 100. The first worm wheel 212 is a worm gear which is disposed coaxially with the first sprocket 211. The first worm 213 is a screw-shaped gear meshed with the first worm wheel 212. The first shaft 214 is coupled with the first worm 213, and this first shaft 214 is connected to the first motor 217 via the first gear mechanism 215 and the first motor shaft 216. Note that the first gear mechanism 215 is a gear for deceleration.

In the first delivery unit 21 configured as described above, rotation drive force of the first motor 217 is transmitted to the first worm wheel 212 via the first motor shaft 216, the first gear mechanism 215, the first shaft 214, and the first worm 213, and the first worm wheel 212 rotates accordingly. When the first worm wheel 212 rotates, the first sprocket 211 rotates in conjunction with the rotation. The rotation of the first sprocket 211 will deliver the component storage tape 100 including the carrier tape 101 including the conveyance force transfer holes 102 into which the teeth of the first sprocket 211 fit.

The second delivery unit 22 is disposed on an upstream end side in the tape feeding direction C of the tape guide installation area 121 within the second accommodation case 12 of the device body 10. The second delivery unit 22 receives the component storage tape 100 that is delivered by the first delivery unit 21 and travels the third tape traveling path 12A through the first tape traveling path 11A and the second tape traveling path 11B. Then, the second delivery unit 22 delivers the component storage tape 100 to the component extraction position P. Accordingly, the second delivery unit 22 causes the component storage tape 100 to travel the fourth tape traveling path 12B in the tape guide installation area 121.

The second delivery unit 22 includes, in a similar manner to the first delivery unit 21, the second sprocket 221, a second worm wheel 222, a second worm 223, a second shaft 224, a second gear mechanism 225, a second motor shaft 226, and a second motor 227.

The second sprocket 221 is a disk-shaped sprocket supported rotatably about an axis extending in the X direction (left and right direction) within the second accommodation case 12. The second sprocket 221 includes a plurality of teeth arranged at predetermined intervals in a circumferential direction. The teeth of the second sprocket 221 can fit into the conveyance force transfer holes 102 formed in the carrier tape 101 of the component storage tape 100. The second worm wheel 222 is a worm gear which is disposed coaxially with the second sprocket 221. The second worm 223 is a screw-shaped gear meshed with the second worm wheel 222. The second shaft 224 is coupled with the second worm 223, and this second shaft 224 is connected to the second motor 227 via the second gear mechanism 225 and the second motor shaft 226. Note that the second gear mechanism 225 is a gear for deceleration.

In the second delivery unit 22 configured as described above, rotation drive force of the second motor 227 is transmitted to the second worm wheel 222 via the second motor shaft 226, the second gear mechanism 225, the second shaft 224, and the second worm 223, and the second worm wheel 222 rotates accordingly. When the second worm wheel 222 rotates, the second sprocket 221 rotates in conjunction with the rotation. The rotation of the second sprocket 221 will deliver the component storage tape 100 including the carrier tape 101 including the conveyance force transfer holes 102 into which the teeth of the second sprocket 221 fit.

Note that when a tip portion of the component storage tape 100 delivered by the first delivery unit 21 reaches the second sprocket 221 and the teeth of the second sprocket 221 fit into the conveyance force transfer holes 102 of the carrier tape 101 in the tip portion of the component storage tape 100, the first motor 217 stops. Although a rotation shaft of the first sprocket 211 stops when the first motor 217 stops in this way, through a one-way clutch that lies between the rotation shaft and the first sprocket 211, even if the rotation shaft does not rotate, the first sprocket 211 can rotate in conjunction with movement of the component storage tape 100 delivered by rotation of the second sprocket 221.

The third delivery unit 23 is disposed on a downstream end side in the tape feeding direction C of the tape guide installation area 121 within the second accommodation case 12 of the device body 10. That is, the third delivery unit 23 is disposed at a position that agrees with the component extraction position P in the tape feeding direction C. The third delivery unit 23 receives the component storage tape 100 that is delivered by the second delivery unit 22 and travels the fourth tape traveling path 12B. Then, the third delivery unit 23 delivers the component storage tape 100 to pass the component extraction position P. A configuration to dispose the third delivery unit 23 at the position that agrees with the component extraction position P in the tape feeding direction C and to receive the component storage tape 100 by the third delivery unit 23 makes it possible to deliver the component storage tape 100 with precise positioning performed at the component extraction position P.

The third delivery unit 23 includes the third sprocket 231, a third worm wheel 232, and a third worm 233. "The third delivery unit 23 is disposed at the position that agrees with the component extraction position P" described above means that, when viewed from the width direction of the fourth tape traveling path 12B (X direction), the third delivery unit 23 is disposed such that the component extraction position P is positioned within a range of the third sprocket 231 in the tape feeding direction C. When viewed from the width direction of the fourth tape traveling path 12B (X direction), the component extraction position P preferably exists right above a top (top end) of the third sprocket 231. When the component extraction position P is a position shifted from right above the top of the third sprocket 231 in the Y direction, it is preferable that the position be shifted to an upstream side in the tape feeding direction C than to a downstream side. This is because an area portion passing through the component extraction position P in the component storage tape 100 delivered by the third sprocket 231 of the third delivery unit 23 is pulled, leading to little deformation of the area portion and precise positioning performed at the component extraction position P.

The third sprocket 231 is a disk-shaped sprocket supported rotatably about an axis extending in the X direction (left and right direction) within the second accommodation case 12. The third sprocket 231 includes a plurality of teeth arranged at predetermined intervals in a circumferential direction. The teeth of the third sprocket 231 can fit into the conveyance force transfer holes 102 formed in the carrier tape 101 of the component storage tape 100. The third worm wheel 232 is a worm gear which is disposed coaxially with the third sprocket 231. The third worm 233 is a screw-shaped gear meshed with the third worm wheel 232. The second shaft 224 is coupled with the third worm 233, and this second shaft 224 is connected to the second motor 227 via the second gear mechanism 225 and the second motor shaft 226.

In the third delivery unit 23 configured as described above, rotation drive force of the second motor 227 is transmitted to the third worm wheel 232 via the second motor shaft 226, the second gear mechanism 225, the second shaft 224, and the third worm 233, and the third worm wheel 232 rotates accordingly. When the third worm wheel 232 rotates, the third sprocket 231 rotates in conjunction with the rotation. The rotation of the third sprocket 231 will deliver the component storage tape 100 including the carrier tape 101 including the conveyance force transfer holes 102 into which the teeth of the third sprocket 231 fit.

Figure 6:
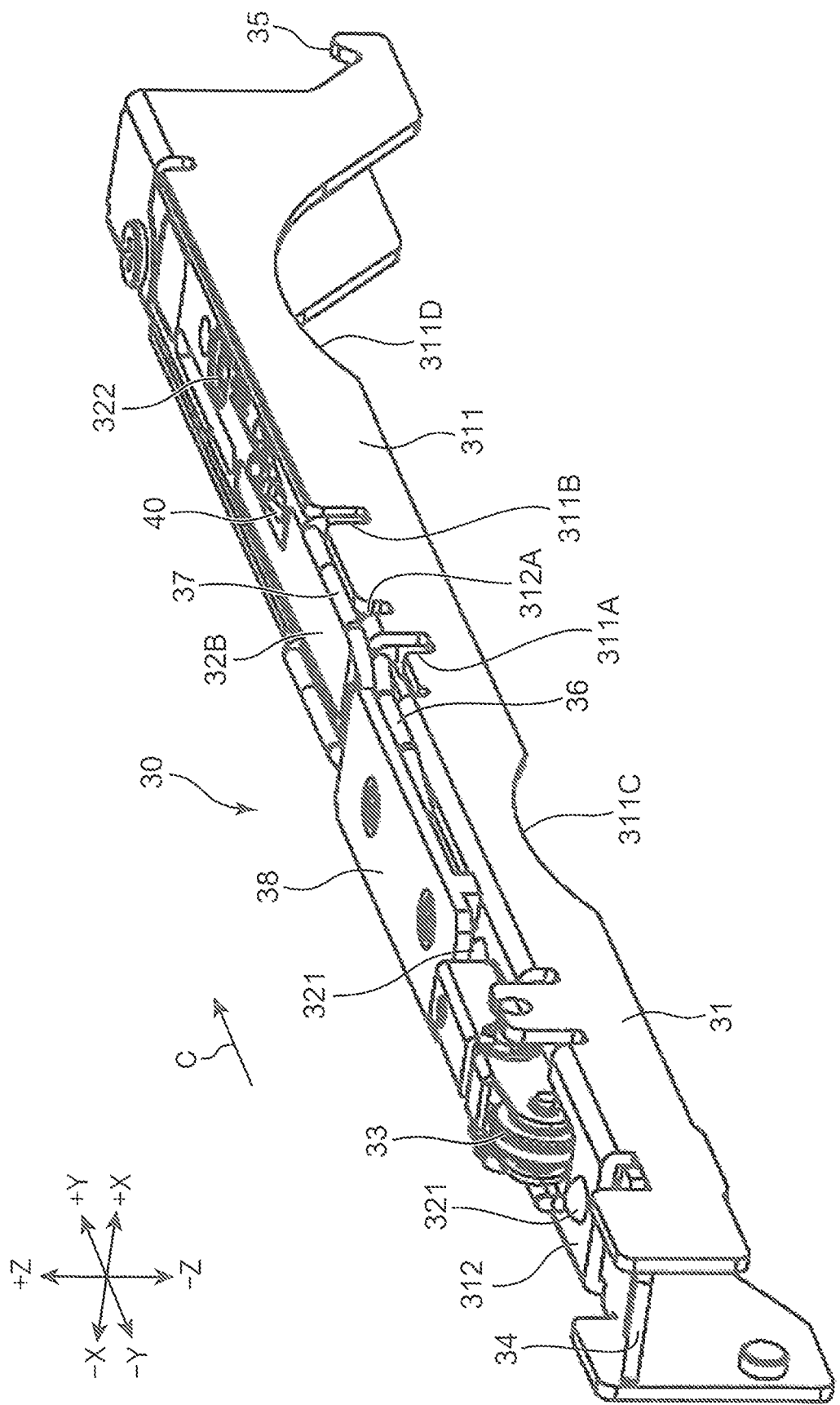
FIG. 6 is a perspective view showing a configuration of a tape guide included in the component supply device.
Figure 7:
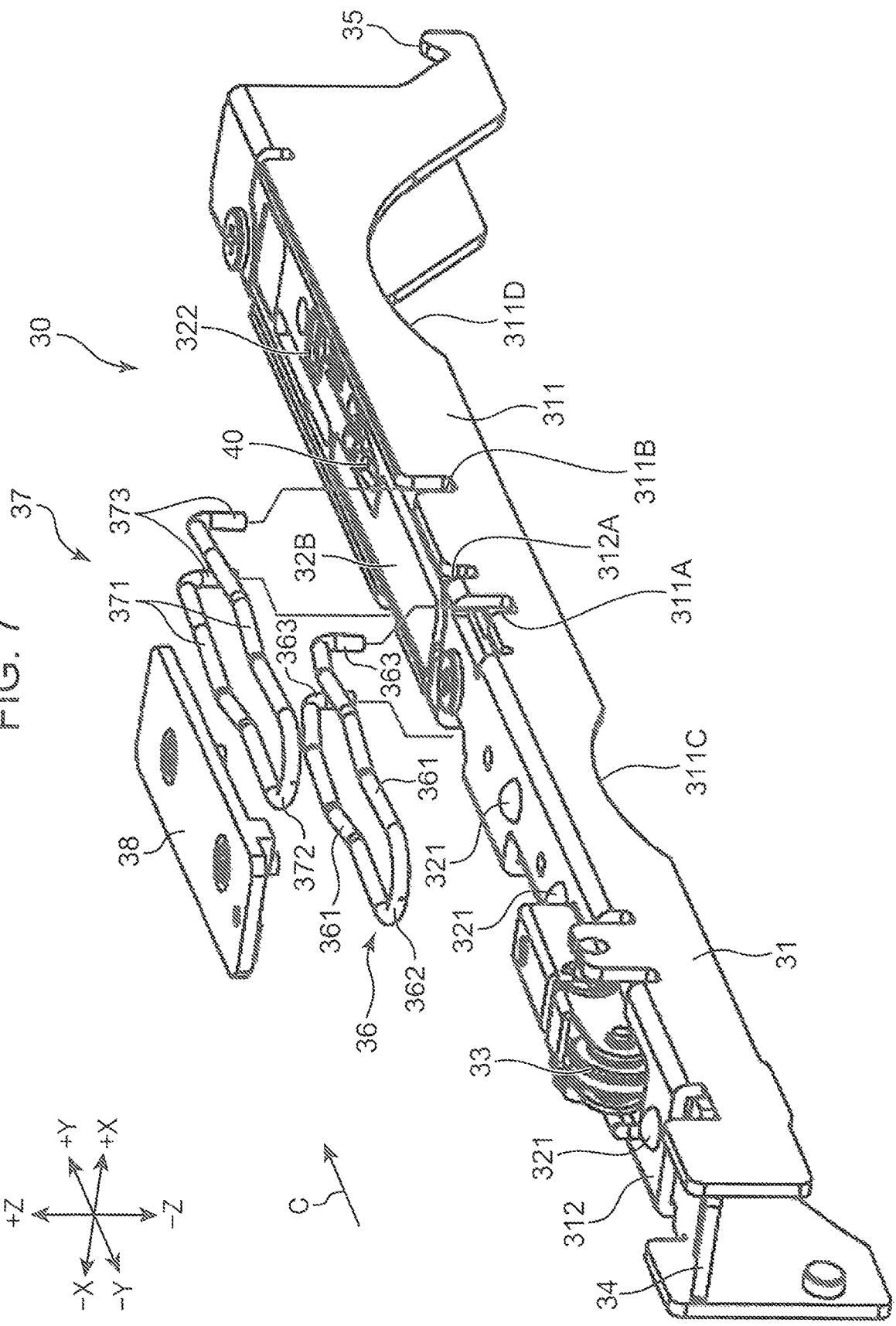
FIG. 7 is an exploded perspective view of the tape guide of FIG. 6.
Figure 8:
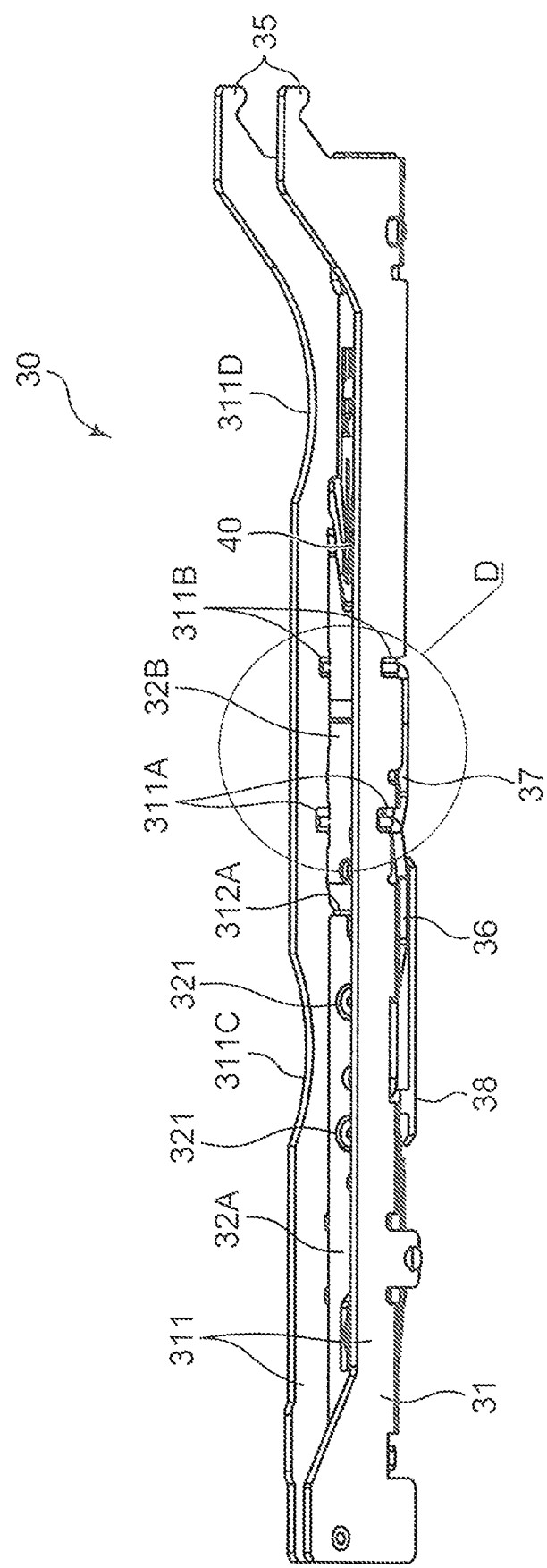
FIG. 8 is a perspective view showing the tape guide of FIG. 6 with an inside facing upward.
Figure 9:
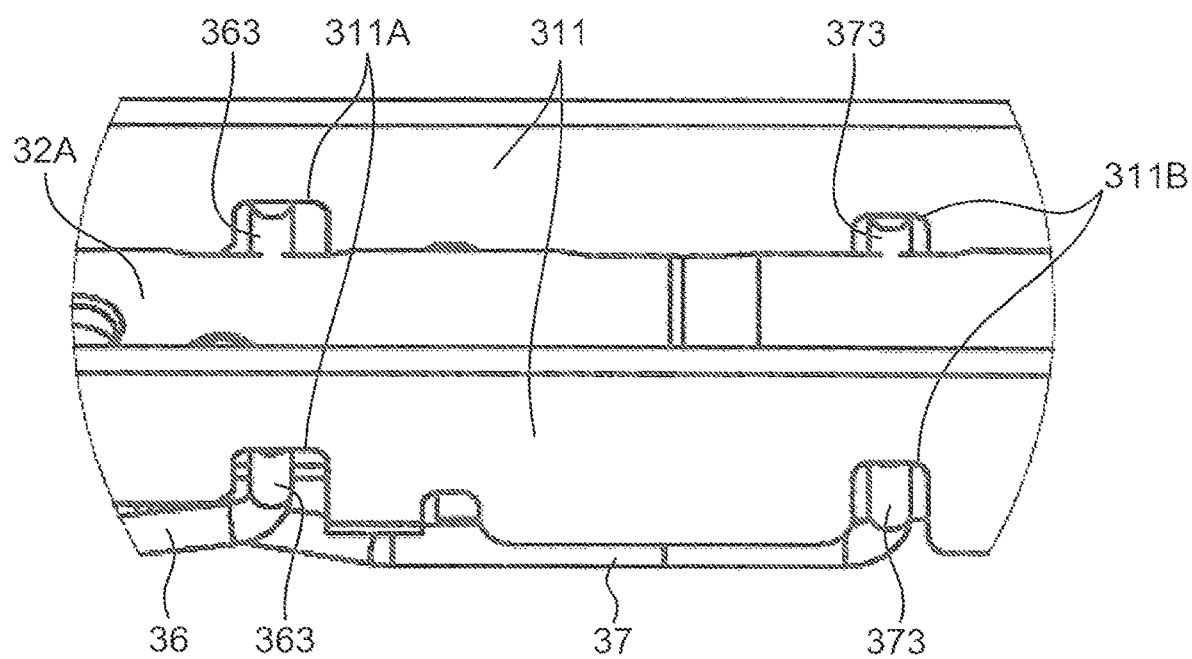
FIG. 9 is a diagram showing area D enlarged in the tape guide of FIG. 8.
Figure 10:
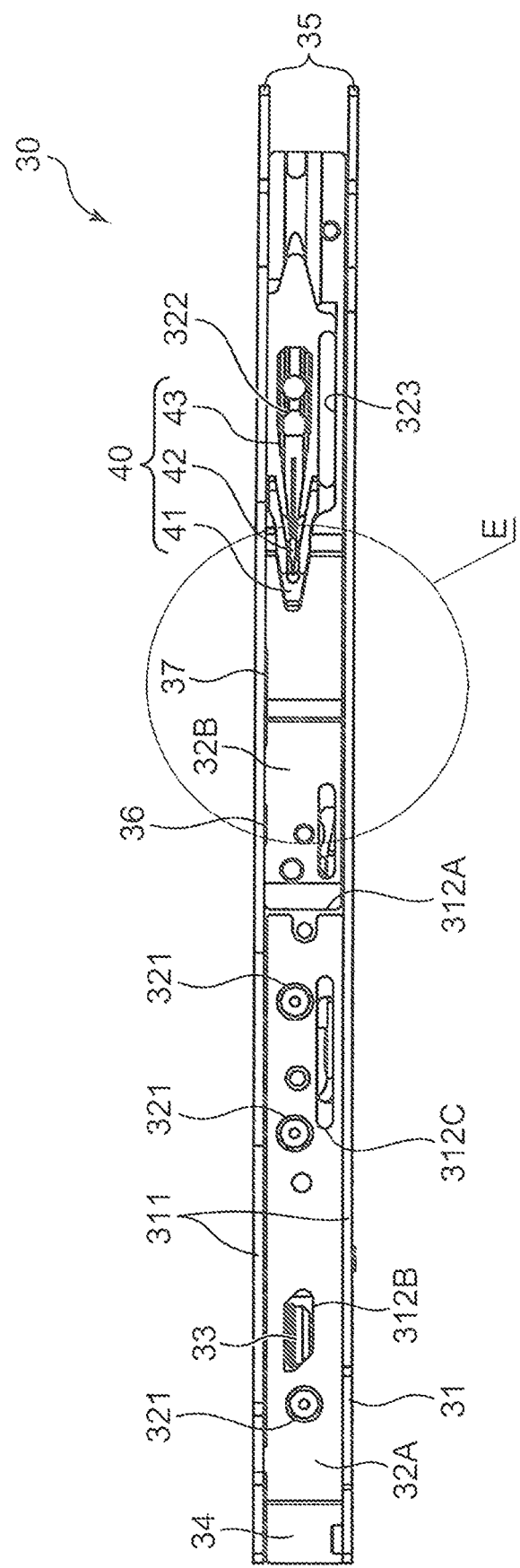
FIG. 10 is a plan view of the tape guide of FIG. 6 viewed from an inside.
Figure 11:
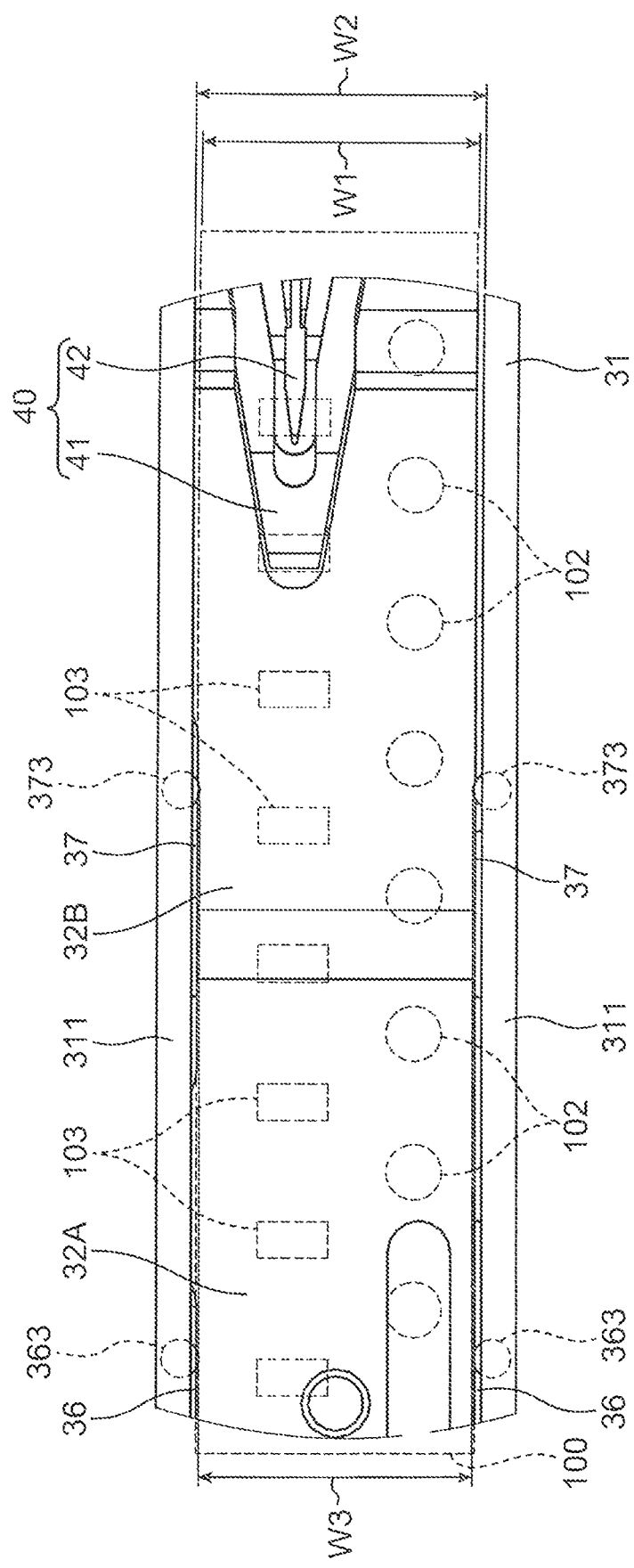
FIG. 11 is a diagram showing area E enlarged in the tape guide of FIG. 10.
Figure 12:
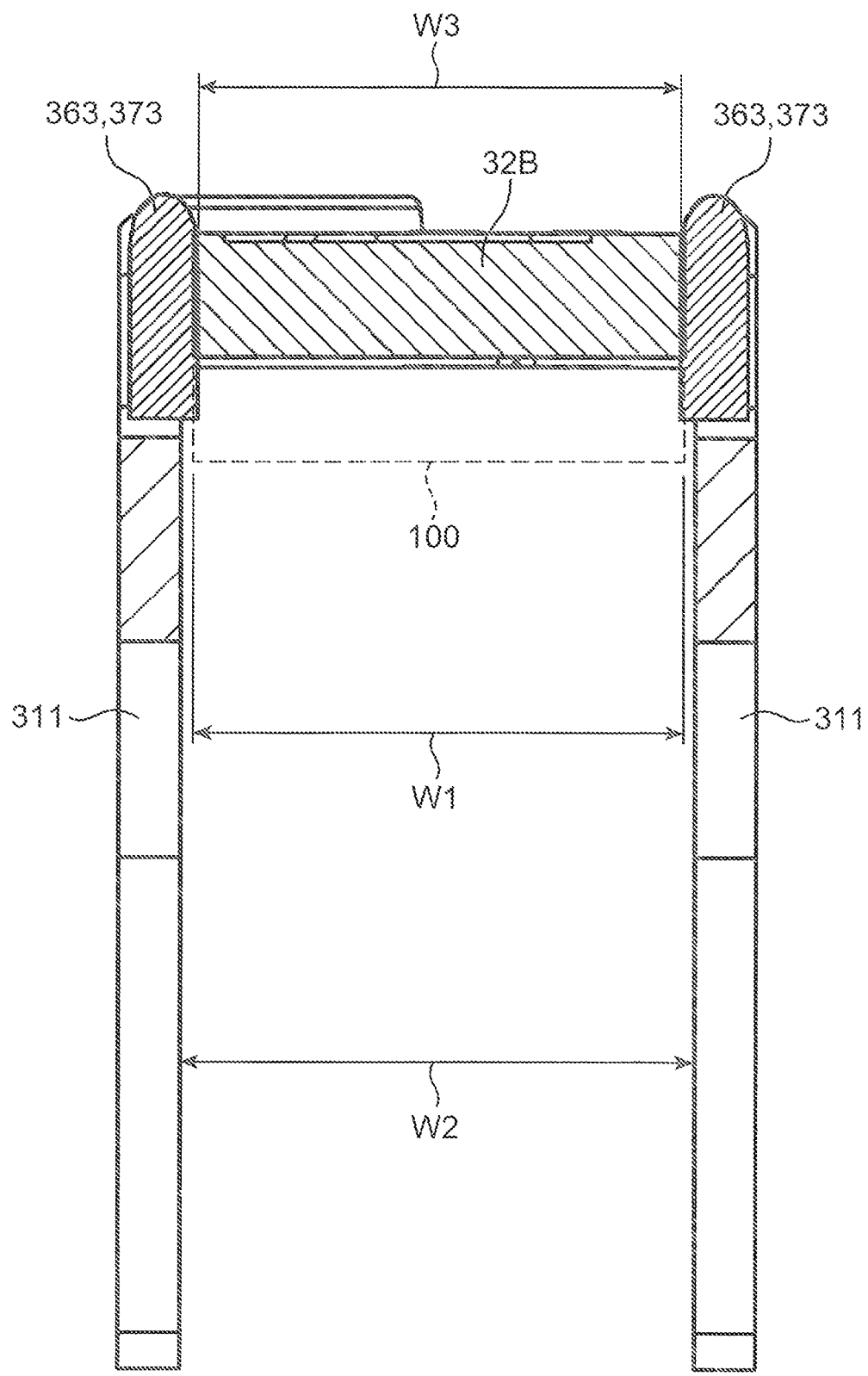
FIG. 12 is a cross-sectional view of the tape guide of FIG. 6.

Next, in addition to FIG. 2, with reference to FIGS. 6 to 12, the tape guide 30 included in the component supply device 1 will be described. FIG. 6 is a perspective view showing a configuration of the tape guide 30 included in the component supply device 1. FIG. 7 is an exploded perspective view of the tape guide 30. FIG. 8 is a perspective view showing the tape guide 30 with an inside facing upward. FIG. 9 is a diagram showing area D enlarged in the tape guide 30 of FIG. 8. FIG. 10 is a plan view showing the tape guide 30 viewed from the inside. FIG. 11 is a diagram showing area E enlarged in the tape guide 30 of FIG. 10. FIG. 12 is a cross-sectional view of the tape guide 30.

The tape guide 30 is a slender member extending in the Y direction (front and rear direction), and is attached to the tape guide installation area 121 in the second accommodation case 12 of the device body 10. A width of this tape guide 30 is set to be equal to the width of the second accommodation case 12. The tape guide 30 guides the component storage tape 100 delivered by the second delivery unit 22 and the third delivery unit 23 to travel on the fourth tape traveling path 12B. In the present embodiment, the tape guide 30 is attached to the tape guide installation area 121 so as to cover the upper surface 121A of the tape guide installation area 121 in the second accommodation case 12 from above.

The tape guide 30 includes a guide body 31, a first plate-shaped body 32A, a second plate-shaped body 32B, a roller 33 for dropping the component 105 attached to a reverse side of the cover tape 104 into the component housing part 103, a first locking part 34, a second locking part 35, a first positioning guide member 36, a second positioning guide member 37, and a fixing member 38.

The guide body 31 constitutes an outline of the tape guide 30, and covers the upper surface 121A of the tape guide installation area 121 from above with the tape guide 30 being attached to the tape guide installation area 121 in the second accommodation case 12. The guide body 31 includes a pair of side wall parts 311 extending in parallel in the Y direction (front and rear direction), and an upper wall part 312 that couples areas on the −Y side (rear side) of upper ends in the pair of side wall parts 311 along the Y direction (front and rear direction). That is, the guide body 31 includes an opening 312A in which an area on the +Y side (front side) of the upper ends in the pair of side wall parts 311 is open upward.

In the guide body 31, the pair of side wall parts 311 and the upper wall part 312 define the fourth tape traveling path 12B in cooperation with the upper surface 121A of the tape guide installation area 121 in the second accommodation case 12. Side surfaces of the component storage tape 100 traveling the fourth tape traveling path 12B are guided by the pair of side wall parts 311. A surface of the component storage tape 100 on the cover tape 104 side is guided by the upper wall part 312. A surface of the component storage tape 100 on the carrier tape 101 side is guided by the upper surface 121A of the tape guide installation area 121.

Here, when a description is made with reference to FIGS. 11 and 12, the component storage tape 100 is manufactured such that its width size is within a predetermined tolerance. Therefore, an allowable width according to the tolerance is set for the width of the component storage tape 100. For example, when a target setting width W1 of the component storage tape 100 is 8 mm, the tolerance is set from −0.1 mm to +0.3 mm, the allowable width of the component storage tape 100 is from 7.9 mm to 8.3 mm, and the maximum allowable width is 8.3 mm.

In the component supply device 1, to enable the component storage tape 100 within the allowable width to travel, the widths of the first tape traveling path 11A, the second tape traveling path 11B, the third tape traveling path 12A, and the fourth tape traveling path 12B on which the component storage tape 100 travel are set to be wider than the maximum allowable width of the component storage tape 100. That is, when the fourth tape traveling path 12B is taken as an example with reference to FIGS. 11 and 12, a separation distance W2 between the pair of side wall parts 311 that defines the fourth tape traveling path 12B is set to be wider than the maximum allowable width of the component storage tape 100. Note that the separation distance W2 between the pair of side wall parts 311 is a distance between inward side surfaces in the pair of side wall parts 311. For example, when the maximum allowable width of the component storage tape 100 is 8.3 mm, the separation distance W2 between the pair of side wall parts 311 that defines the fourth tape traveling path 12B is set at 8.4 mm, which is wider than the maximum allowable width.

Also, as shown in FIGS. 6 to 9, in each of the pair of side wall parts 311 in the guide body 31, a first cutout part 311A and a second cutout part 311B which are cut out downward from the upper end are formed at predetermined intervals in the Y direction (front and rear direction). The first cutout part 311A is formed on the −Y side (rear side) in the Y direction (front and rear direction) with respect to the second cutout part 311B. In the first cutout part 311A formed in each of the pair of side wall parts 311, a first bent part 363 of the first positioning guide member 36 to be described later is disposed. In the second cutout part 311B formed in each of the pair of side wall parts 311, a second bent part 373 of the second positioning guide member 37 to be described later is disposed.

At a lower end on the +X side (right side) side wall part 311 among the pair of side wall parts 311, a first recessed portion 311C is formed in an area corresponding to the second sprocket 221 in the Y direction (front and rear direction), and a second recessed portion 311D is formed in an area corresponding to the third sprocket 231 in the Y direction (front and rear direction).

As shown in FIGS. 7 and 10, the first plate-shaped body 32A is attached by a caulking part 321 of a caulking pin on a lower side of the upper wall part 312 in the guide body 31. Furthermore, an upper wall first opening 312B is formed on the upper wall part 312 such that part of the roller 33 is exposed into the guide body 31. The roller 33 has a function of dropping the component 105 attached to the reverse side of the cover tape 104 into the component housing part 103. In addition, an upper wall second opening 312C for avoiding interference of the second sprocket 221 in the upper wall part 312 is formed in the upper wall part 312.

In the tape guide 30, the second plate-shaped body 32B is fixed to the upper wall part 312, for example, with screws to close the opening 312A that is open upward in the +Y side (front side) area in the upper ends of the pair of side wall parts 311. This second plate-shaped body 32B is disposed between the pair of side wall parts 311 so as to face the upper surface 121A of the tape guide installation area 121 in parallel in the second accommodation case 12. Also, in the second plate-shaped body 32B, a component extraction opening 322 is formed corresponding to the component extraction position P, and an interference avoidance opening 323 is formed for avoiding interference of the third sprocket 231 in the plate-shaped body 32.

Furthermore, as shown in FIG. 10, a component exposure part 40 is attached to the second plate-shaped body 32B of the tape guide 30. Although the component exposure part 40 is attached to the second plate-shaped body 32B in the present embodiment, the component exposure part 40 may be attached to the upper surface 121A of the tape guide installation area 121 in the second accommodation case 12.

Figure 13:
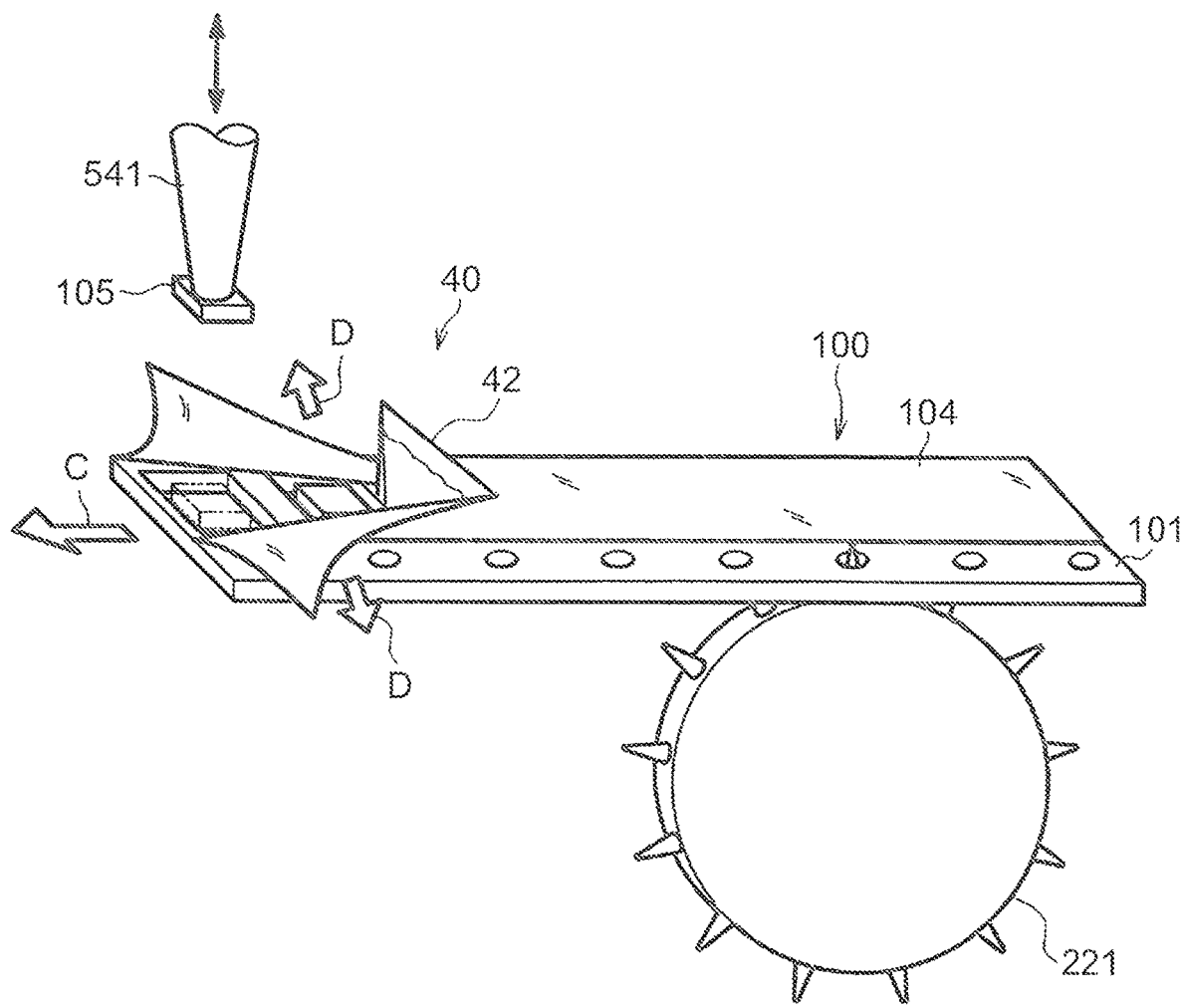
FIG. 13 is a diagram for describing how components in the component storage tape are exposed.

The component exposure part 40 exposes the components 105 in the component storage parts 103 of the component storage tape 100 that is guided by the tape guide 30 and travels the fourth tape traveling path 12B. In addition to FIGS. 10 and 11, the component exposure part 40 will be described with reference to FIG. 13. FIG. 13 is a diagram for describing how the components 105 in the component storage tape 100 are exposed.

The component exposure part 40 includes an insertion part 41, a cutting part 42, and a cover tape post-processing part 43. In the component exposure part 40, the insertion part 41 is a tapered thin-plate part, and is inserted between the carrier tape 101 and the cover tape 104 of the component storage tape 100 delivered by the second delivery unit 22, the component storage tape 100 traveling the fourth tape traveling path 12B with a tip as a free end. In the component exposure part 40, the cutting part 42 is disposed on a downstream side from the insertion part 41 in the tape feeding direction C, and cuts the cover tape 104 in a straight line along the tape feeding direction C according to traveling of the component storage tape 100. In the component exposure part 40, the cover tape post-processing part 43 is disposed on a downstream side from the cutting part 42 in the tape feeding direction C, and performs processing for spreading out the cover tape 104 that is cut by the cutting part 42 in a direction of arrow D shown in FIG. 13. This allows the components 105 to be exposed within the component storage parts 103 of the component storage tape 100. The components 105 exposed within the component storage parts 103 in this way are sucked by a nozzle 541 of the component mounting head 54 in the component mounter 50 and is taken out at the component extraction position P via the component extraction opening 322.

In the tape guide 30, the first locking part 34 is disposed at the −Y side (rear side) end of the guide body 31, as shown in FIGS. 6, 7, and 10. The first locking part 34 is engaged with the first holding unit 122 of the tape guide installation area 121 in the second accommodation case 12. Accordingly, the −Y side (rear side) end of the tape guide 30 is held at the −Y side (rear side) end of the tape guide installation area 121.

In the tape guide 30, the second locking part 35 is disposed at the +Y side (front side) end of the guide body 31, as shown in FIGS. 6, 7, and 10. The second locking part 35 is engaged with the second holding unit 123 of the tape guide installation area 121 in the second accommodation case 12. Accordingly, the +Y side (front side) end of the tape guide 30 is held at the +Y side (front side) end of the tape guide installation area 121.

In the present embodiment, attachment structure of the tape guide 30 to the tape guide installation area 121 is formed by the first and second locking parts 34 and 35 of the tape guide 30, and the first and second holding units 122 and 123 of the tape guide installation area 121 in the second accommodation case 12.

In the tape guide 30, as shown in FIGS. 6 to 11, the first positioning guide member 36 and the second positioning guide member 37 are disposed on an upstream side in the tape feeding direction C with respect to the component exposure part 40 on the fourth tape traveling path 12B. The first positioning guide member 36 is disposed on an upstream side in the tape feeding direction C with respect to the second positioning guide member 37. The first positioning guide member 36 and the second positioning guide member 37 guide the side surfaces of the component storage tape 100 such that the component storage tape 100 travels toward the component exposure part 40 with positioning performed in the width direction of the fourth tape traveling path 12B (X direction, left and right direction).

In the present embodiment, the first positioning guide member 36 and the second positioning guide member 37 each include a wire spring. Note that FIGS. 6 to 11 illustrate configurations including two positioning guide members including wire springs: the first positioning guide member 36 and the second positioning guide member 37. However, the number of positioning guide members may not be limited to two, and may be one, and may be equal to or greater than three.

As shown in FIG. 7, the first positioning guide member 36 including a wire spring has a shape with one wire spring bent in a central portion and is elastically deformable, and the first bent parts 363 are formed in both end areas. Specifically, the first positioning guide member 36 includes a pair of first extending parts 361 extending in the Y direction (front and rear direction), a first coupling part 362 that is curved in a protruding shape on the −Y side (rear side) and couples the −Y side (rear side) ends of the pair of first extending parts 361, and the first bent parts 363 that are bent on the −Z side (lower side) in end areas on the +Y side (front side) of the pair of first extending parts 361. In the first positioning guide member 36 formed in this way, each first bent part 363 is disposed in the first cutout part 311A formed in each of the pair of side wall parts 311 in the guide body 31, and functions as the pair of tape side surface guide parts that guides the side surface of the component storage tape 100.

The first positioning guide member 36 includes the wire spring having a shape bent in the central portion, and each first bent part 363 that functions as the tape side surface guide part is disposed in the first cutout part 311A formed in each of the pair of side wall parts 311. Therefore, in each first bent part 363 in the first positioning guide member 36, the separation distance between sections that guide the side surfaces of the component storage tape 100 in the width direction of the fourth tape traveling path 12B (X direction, left and right direction) can be changed according to the width of the component storage tape 100.

Also, when a description is made with reference to FIGS. 11 and 12, in the first positioning guide member 36, the first bent parts 363 that function as the pair of tape side surface guide parts are apart from each other at a distance shorter than the separation distance W2 between the pair of side wall parts 311 corresponding to the width of the fourth tape traveling path 12B. That is, a separation distance W3 between the first bent parts 363 in the width direction of the fourth tape traveling path 12B (X direction, left and right direction) is set shorter than the separation distance W2 between the pair of side wall parts 311. Specifically, the separation distance W3 between the first bent parts 363 is set as the same value as the target setting width W1 of the component storage tape 100. Note that the separation distance W3 between the first bent parts 363 is a distance between inward ends of the first bent parts 363. For example, when the target setting width W1 of the component storage tape 100 is 8 mm, the maximum allowable width of the component storage tape 100 is 8.3 mm, and the separation distance W2 between the pair of side wall parts 311 that defines the fourth tape traveling path 12B is set at 8.4 mm, then the separation distance W3 between the first bent parts 363 is set at 8 mm, which is equal to the target setting width W1.

In a similar manner to the first positioning guide member 36, the second positioning guide member 37 including a wire spring has a shape with one wire spring bent in a central portion and is elastically deformable, and the second bent parts 373 are formed in both end areas. Specifically, the second positioning guide member 37 includes a pair of second extending parts 371 extending in the Y direction (front and rear direction), a second coupling part 372 that is curved in a protruding shape on the −Y side (rear side) and couples the −Y side (rear side) ends of the pair of second extending parts 371, and second bent parts 373 that are bent on the −Z side (lower side) in end areas on the +Y side (front side) of the pair of second extending parts 371. In the second positioning guide member 37 formed in this way, each second bent part 373 is disposed in the second cutout part 311B formed in each of the pair of side wall parts 311 in the guide body 31, and functions as the pair of tape side surface guide parts that guide the side surfaces of the component storage tape 100.

The second positioning guide member 37 includes a wire spring having a shape bent in a central portion, and each second bent part 373 that functions as the tape side surface guide part is disposed in the second cutout part 311B formed in each of the pair of side wall parts 311. Therefore, in each second bent part 373 in the second positioning guide member 37, the separation distance between sections that guide the side surfaces of the component storage tape 100 in the width direction of the fourth tape traveling path 12B (X direction, left and right direction) can be changed according to the width of the component storage tape 100.

Also, when a description is made with reference to FIG. 11 and FIG. 12, in the second positioning guide member 37, the second bent parts 373 that function as the pair of tape side surface guide parts are apart from each other at a distance shorter than the separation distance W2 between the pair of side wall parts 311 corresponding to the width of the fourth tape traveling path 12B. That is, the separation distance W3 between the second bent parts 373 in the width direction of the fourth tape traveling path 12B (X direction, left and right direction) is set shorter than the separation distance W2 between the pair of side wall parts 311. Specifically, the separation distance W3 between the second bent parts 373 is set as the same value as the target setting width W1 of the component storage tape 100. Note that the separation distance W3 between the second bent parts 373 is a distance between inward ends of the second bent parts 373. For example, when the target setting width W1 of the component storage tape 100 is 8 mm, the maximum allowable width of the component storage tape 100 is 8.3 mm, and the separation distance W2 between the pair of side wall parts 311 that defines the fourth tape traveling path 12B is set at 8.4 mm, then the separation distance W3 between the second bent parts 373 is set at 8 mm, which is equal to the target setting width W1.

In the tape guide 30, as shown in FIGS. 6 and 7, the first positioning guide member 36 and the second positioning guide member 37 are attached to the upper wall part 312 of the guide body 31 so as to be held from above by the fixing member 38.

In the component supply device 1 configured as described above, the component storage tape 100 traveling toward the component exposure part 40 is guided by the tape guide 30. In this tape guide 30, in the first positioning guide member 36 and the second positioning guide member 37, the first bent parts 363 and the second bent parts 373 that function as the tape side surface guide parts are apart from each other at a distance shorter than the width of the fourth tape traveling path 12B. Accordingly, even if the width of the fourth tape traveling path 12B the component storage tape 100 travels is wider than the maximum allowable width of the component storage tape 100, displacement of the component storage tape 100 in the width direction of the fourth tape traveling path 12B is restricted. This enables the component storage tape 100 to travel toward the component exposure part 40 with positioning performed in the width direction of the fourth tape traveling path 12B. As a result, occurrence of poor exposure of the components 105 within the component storage parts 103 of the component storage tape 100 is suppressed, and the components 105 can be supplied efficiently.

In the first positioning guide member 36 and the second positioning guide member 37 including wire springs with a shape bent in the central portion, in each of the first bent part 363 and the second bent part 373 that function as the tape side surface guide parts, the separation distance between sections that guide the side surfaces of the component storage tape 100 in the width direction of the fourth tape traveling path 12B (X direction, left and right direction) can be changed according to the width of the component storage tape 100. Therefore, with the simple configuration using a wire spring, displacement of the component storage tape 100 in the width direction of the fourth tape traveling path 12B is suitably restricted while ensuring good traveling performance of the component storage tape 100 on the fourth tape traveling path 12B.

Furthermore, attachment structure of the tape guide 30 to the tape guide installation area 121 is formed by the first and second locking parts 34 and 35 of the tape guide 30, and the first and second holding units 122 and 123 of the tape guide installation area 121 in the second accommodation case 12. In this configuration, the tape guide 30 is attached to the tape guide installation area 121 with displacement allowed in the Z direction (up and down direction). The component exposure part 40 is attached to the second plate-shaped body 32B of the tape guide 30 with displacement allowed in the Z direction (up and down direction).

In this aspect, since displacement is allowed in the Z direction (up and down direction), the tape guide 30 attached to the tape guide installation area 121 can suitably guide traveling of the component storage tape 100 on the fourth tape traveling path 12B according to a thickness of the component storage tape 100. Since the component exposure part 40 is attached to the tape guide 30 with displacement allowed in the Z direction (up and down direction), the position of the component exposure part 40 in the Z direction (up and down direction) can also be changed according to the thickness of the component storage tape 100. Therefore, occurrence of poor exposure of the components 105 in the component storage parts 103 of the component storage tape 100 resulting from a difference in thickness of the component storage tape 100 can also be suppressed.

Figure 14:
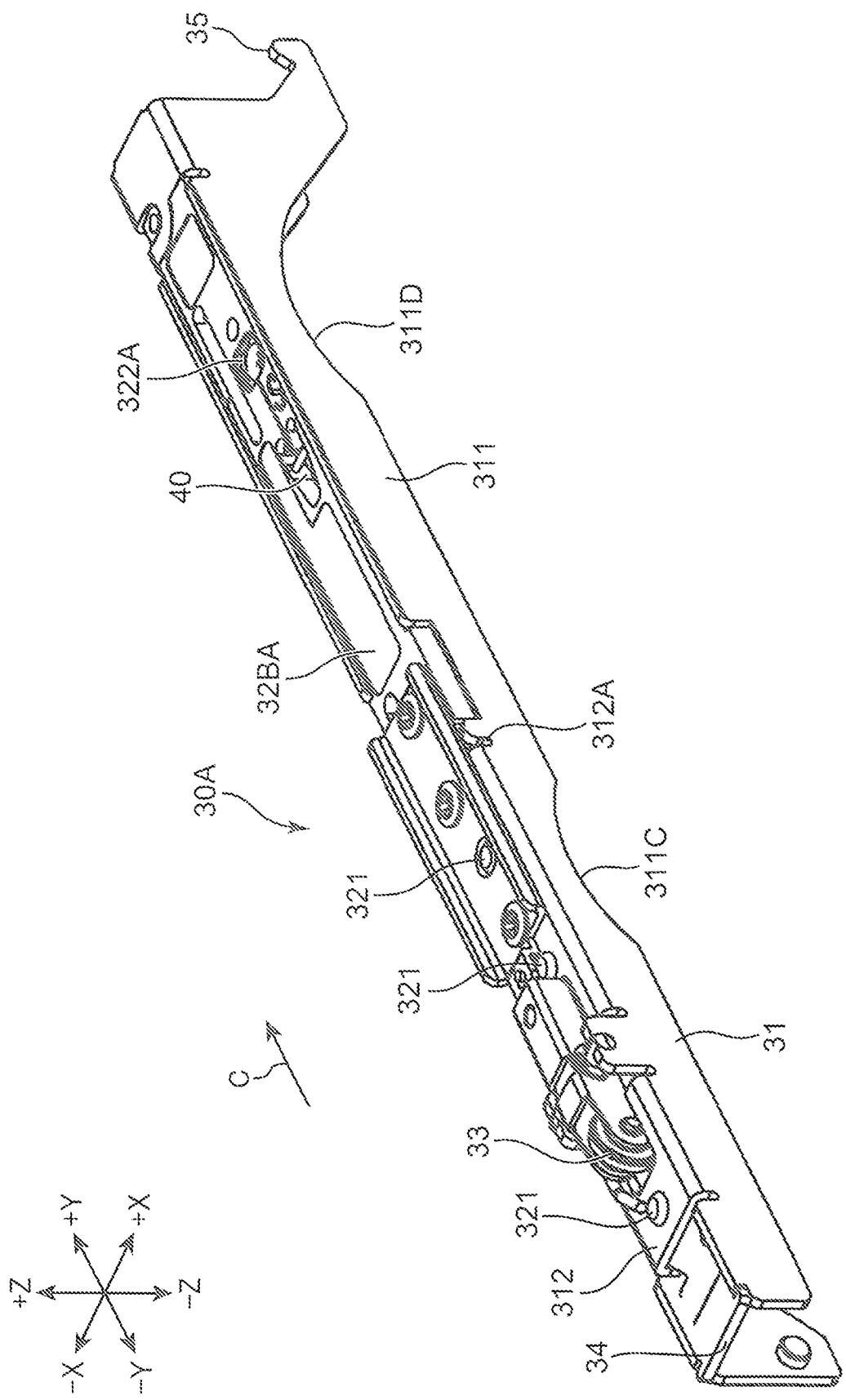
FIG. 14 is a perspective view showing a modified example of the tape guide included in the component supply device.
Figure 15:
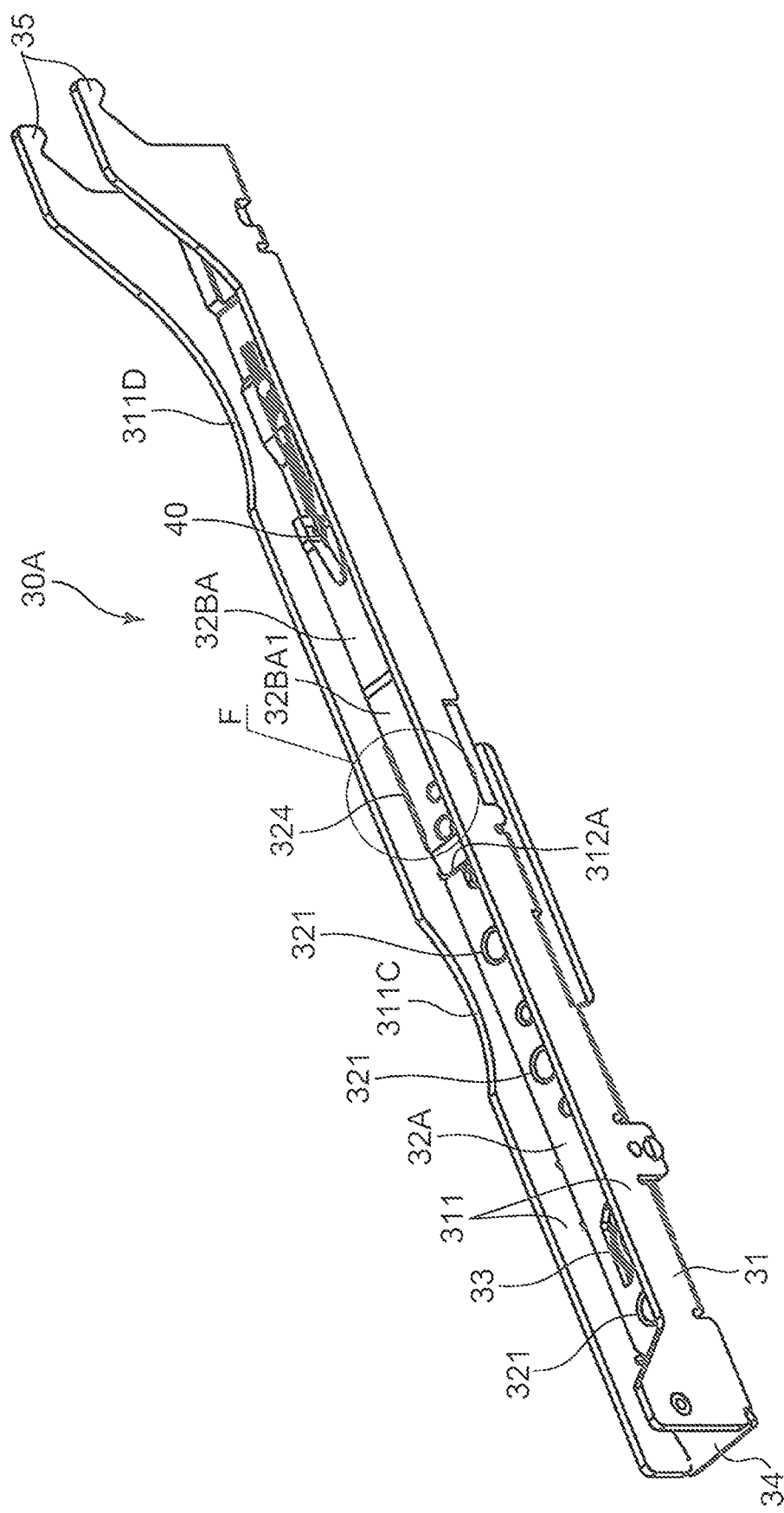
FIG. 15 is a perspective view showing the tape guide of FIG. 14 with an inside facing upward.
Figure 16:
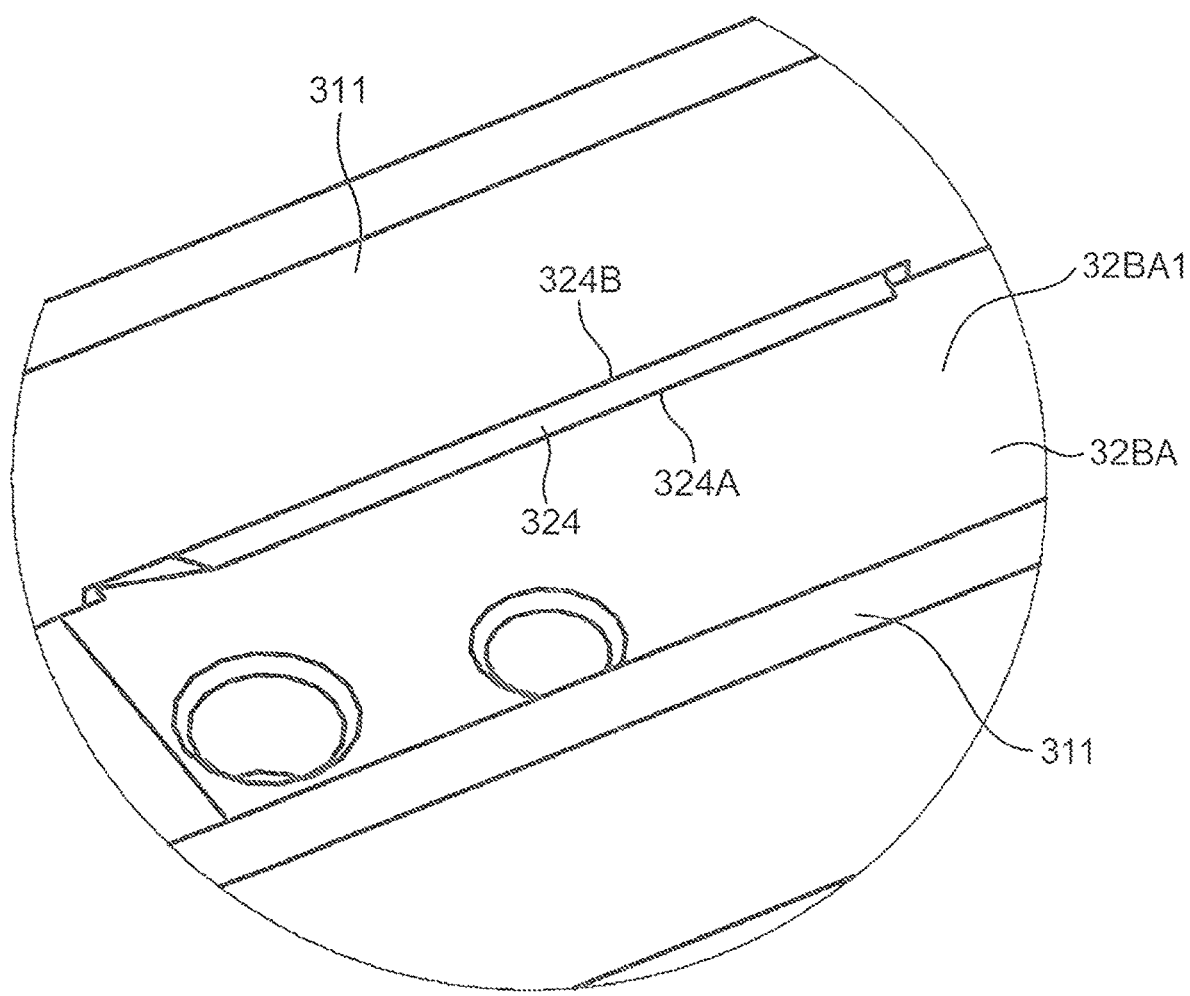
FIG. 16 is a diagram showing area F enlarged in the tape guide of FIG. 15.
Figure 17:
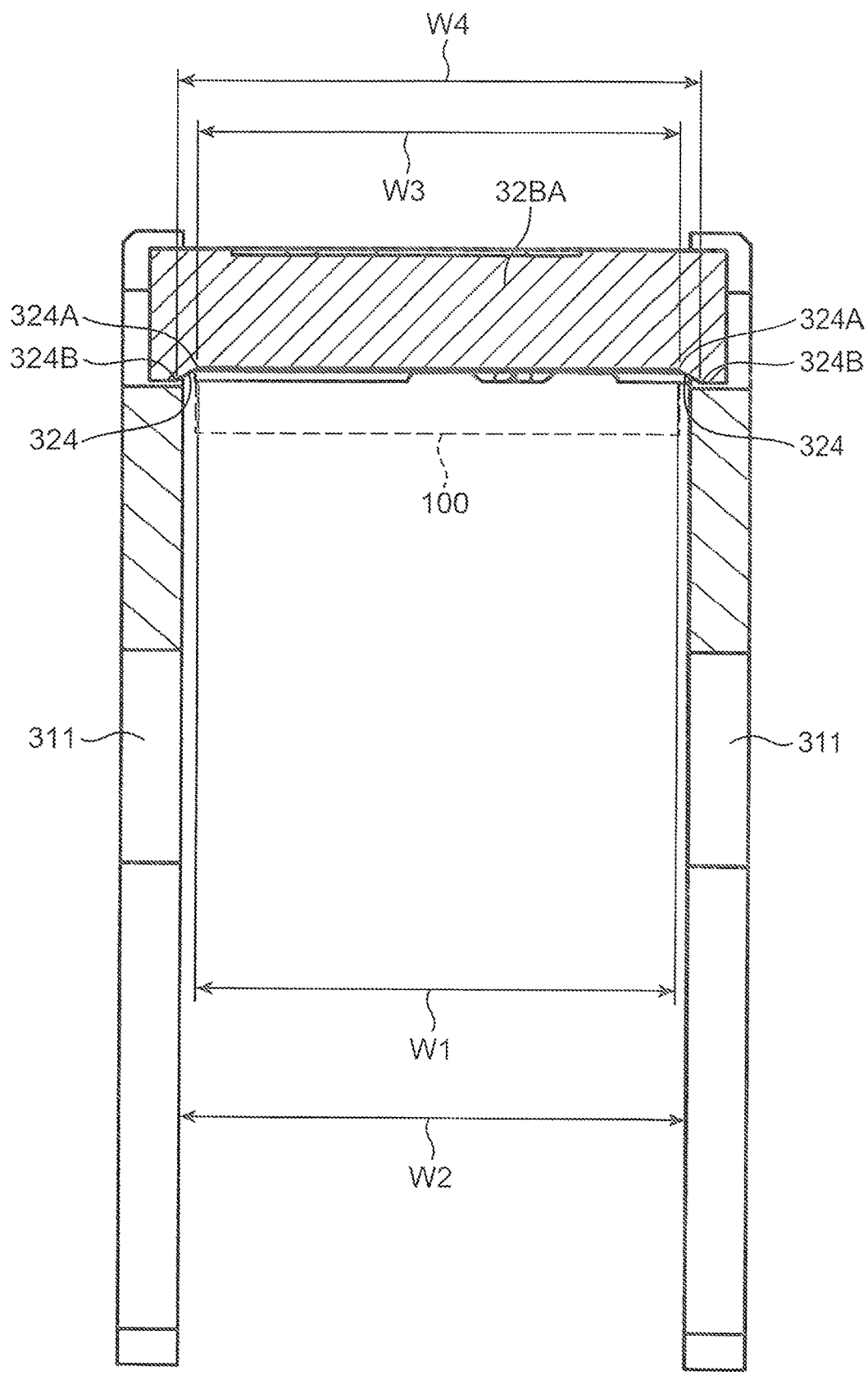
FIG. 17 is a cross-sectional view of the tape guide of FIG. 14.

Next, a modified example of the tape guide included in the component supply device 1 will be described with reference to FIGS. 14 to 17. FIG. 14 is a perspective view showing a tape guide 30A according to the modified example of the tape guide included in the component supply device 1. FIG. 15 is a perspective view showing the tape guide 30A with an inside facing upward. FIG. 16 is a diagram showing area F enlarged in the tape guide 30A of FIG. 15. FIG. 17 is a cross-sectional view of the tape guide 30A.

The configuration has been described in which the tape guide 30 includes the first positioning guide member 36 and the second positioning guide member 37 including wire springs. The tape guide 30A shown in FIGS. 14 to 17 does not include a positioning guide member including a wire spring. A second plate-shaped body 32BA has a function as the positioning guide member. Other than this, the tape guide 30A is configured in a similar manner to the above-described tape guide 30. In this way, the tape guide 30A has parts similar to parts of the above-described tape guide 30. Therefore, in the following descriptions and drawings, corresponding similar parts are denoted with the same reference signs, and descriptions will be omitted.

In the tape guide 30A, the second plate-shaped body 32BA is fixed to the upper wall part 312 of the guide body 31, for example, with screws to close the opening 312A that is open upward in the +Y side (front side) area in the upper ends of the pair of side wall parts 311 of the guide body 31. This second plate-shaped body 32BA is disposed between the pair of side wall parts 311 so as to face the upper surface 121A of the tape guide installation area 121 in parallel in the second accommodation case 12. Also, corresponding to the component extraction position P, a component extraction opening 322A is formed in the second plate-shaped body 32BA. Furthermore, as shown in FIGS. 14 and 15, the component exposure part 40 is attached to the second plate-shaped body 32BA of the tape guide 30A.

In an opposite surface 32BA1 of the second plate-shaped body 32BA facing the upper surface 121A of the tape guide installation area 121, the both end areas in the width direction of the fourth tape traveling path 12B (X direction, left and right direction) include inclined parts 324. In the present embodiment, in the opposite surface 32BA1 of the second plate-shaped body 32BA, the inclined parts 324 are formed in −Y side (rear side) areas upstream with respect to the component exposure part 40. Each inclined part 324 is inclined downward (−Z side) from an inward end 324A toward an outward end 324B. In the inclined parts 324, the inward ends 324A extend in parallel with each other along the Y direction (front and rear direction), and the outward ends 324B also extend in parallel with each other along the Y direction (front and rear direction). The inclined parts 324 formed in both end areas in the width direction of the plate-shaped body 32A have a function as the pair of tape side surface guide parts of the positioning guide member.

When a description is made with reference to FIG. 17, in the inclined parts 324 that function as the pair of tape side surface guide parts, the inward ends 324A are apart from each other at a distance shorter than the separation distance W2 between the pair of side wall parts 311 corresponding to the width of the fourth tape traveling path 12B. That is, the separation distance W3 between the inward ends 324A in the inclined parts 324 in the width direction of the fourth tape traveling path 12B (X direction, left and right direction) is set shorter than the separation distance W2 between the pair of side wall parts 311. Specifically, the separation distance W3 between the inward ends 324A of the inclined parts 324 is set to be equal to the target setting width W1 of the component storage tape 100. For example, when the target setting width W1 of the component storage tape 100 is 8 mm, the maximum allowable width of the component storage tape 100 is 8.3 mm, and the separation distance W2 between the pair of side wall parts 311 that defines the fourth tape traveling path 12B is set at 8.4 mm, then the separation distance W3 between the inward ends 324A of the inclined parts 324 is set at 8 mm, which is equal to the target setting width W1. A separation distance W4 between the outward ends 324B of the inclined parts 324 in the width direction of the fourth tape traveling path 12B (X direction, left and right direction) is set slightly longer than the separation distance W2 between the pair of side wall parts 311. Note that the separation distance W3 between the inward ends 324A in the inclined parts 324 may be set slightly shorter than the target setting width W1 of the component storage tape 100.

With the configuration in which the tape guide 30A includes the second plate-shaped body 32BA including the inclined parts 324, the positioning guide member can be implemented with the simple configuration of disposing the second plate-shaped body 32BA between the pair of side wall parts 311 of the guide body 31. The second plate-shaped body 32BA includes the inclined parts 324 that function as the tape side surface guide parts, and each inclined part 324 is inclined downward from the inward end 324A toward the outward end 324B. Therefore, the separation distance between sections that guide the side surfaces of the component storage tape 100 in the inclined parts 324 is changed according to the width of the component storage tape 100. As a result, with the simple configuration of disposing the second plate-shaped body 32BA between the pair of side wall parts 311 of the guide body 31, displacement of the component storage tape 100 in the width direction of the fourth tape traveling path 12B (X direction, left and right direction) is suitably restricted while ensuring good traveling performance of the component storage tape 100 on the fourth tape traveling path 12B.

Note that the above-described specific embodiment mainly includes the disclosure having the following configurations.

A component supply device according to one aspect of the present disclosure is a device for supplying components to a component extraction position by using a component storage tape including a carrier tape in which a plurality of component storage parts for housing the components are arranged at predetermined intervals, and a cover tape affixed on the carrier tape so as to cover the component storage parts. This component supply device includes: a device body; a tape delivery unit disposed in the device body, the tape delivery unit being configured to deliver the component storage tape toward the component extraction position in a tape feeding direction along an arrangement direction of the component storage parts; a tape guide attached to the device body, the tape guide being configured to guide traveling of the component storage tape delivered by the tape delivery unit; and a component exposure part configured to expose the components in the component storage parts of the component storage tape traveling by being guided by the tape guide. The tape guide includes a guide body including a pair of side wall parts extending along the tape feeding direction, the pair of side wall parts being configured to define a tape traveling path wider than a maximum allowable width of the component storage tape; and a positioning guide member including a pair of tape side surface guide parts disposed on an upstream side in the tape feeding direction with respect to the component exposure part on the tape traveling path, the pair of tape side surface guide parts being configured to guide side surfaces of the component storage tape. The pair of tape side surface guide parts is apart from each other at a distance shorter than a width of the tape traveling path in the width direction, and the pair of tape side surface guide parts guides the component storage tape so as to travel toward the component exposure part with positioning performed in the width direction of the tape traveling path.

With this component supply device, the component storage tape traveling toward the component exposure part is guided by the tape guide. This tape guide includes the guide body and the positioning guide member. In the tape guide, the guide body includes the pair of side wall parts that defines the tape traveling path wider than the maximum allowable width of the component storage tape. In the tape guide, the positioning guide member includes the pair of tape side surface guide parts that guides the side surfaces of the component storage tape, and this pair of tape side surface guide parts is apart from each other at a distance shorter than the width of the tape traveling path. Accordingly, even if the width of the tape traveling path on which the component storage tape travels is wider than the maximum allowable width of the component storage tape, displacement of the component storage tape in the width direction of the tape traveling path is restricted. This enables the component storage tape to travel toward the component exposure part with positioning performed in the width direction of the tape traveling path. As a result, occurrence of poor exposure of components in the component storage parts of the component storage tape is suppressed, and the components can be supplied efficiently.

In the component supply device, the pair of tape side surface guide parts is configured to allow a separation distance between sections that guide the side surfaces of the component storage tape in the width direction to change according to a width of the component storage tape.

In this aspect, in the pair of tape side surface guide parts, the separation distance between sections that guide the side surfaces of the component storage tape is changed according to the width of the component storage tape. Therefore, displacement of the component storage tape in the width direction of the tape traveling path is suitably restricted while ensuring good traveling performance of the component storage tape on the tape traveling path.

In the component supply device, the device body includes a tape guide installation area that is an area to which the tape guide is attached, defines the tape traveling path in cooperation with the pair of side wall parts of the guide body, and includes an upper surface covered with the guide body from above. The tape guide is attached to the tape guide installation area with displacement allowed in an up and down direction orthogonal to both the tape feeding direction and the width direction. The component exposure part is attached to the tape guide.

In this aspect, since displacement is allowed in the up and down direction, the tape guide attached to the tape guide installation area of the device body can suitably guide traveling of the component storage tape on the tape traveling path according to the thickness of the component storage tape. Furthermore, since the component exposure part is attached to the tape guide with displacement allowed in the up and down direction, a position of the component exposure part in the up and down direction can also be changed according to the thickness of the component storage tape. Therefore, occurrence of poor exposure of the components in the component storage parts of the component storage tape resulting from a difference in thickness of the component storage tape can also be suppressed.

In the component supply device, the positioning guide member preferably includes a wire spring. Accordingly, the positioning guide member can be implemented with the simple configuration using a wire spring.

In the component supply device, the wire spring has a shape bent in a central portion and includes bent parts in both end areas. Cutout parts in which the bent parts are disposed are formed in the pair of side wall parts of the guide body. The bent parts function as the tape side surface guide parts while being disposed in the cutout parts.

In this aspect, the wire spring that constitutes the positioning guide member has a shape bent in a central portion, and the bent parts that function as the tape side surface guide parts are disposed in the cutout parts formed in the pair of side wall parts of the guide body. Therefore, the separation distance between the bent parts can be changed according to the width of the component storage tape. Therefore, with the simple configuration using the wire spring, displacement of the component storage tape in the width direction of the tape traveling path is suitably restricted while ensuring good traveling performance of the component storage tape on the tape traveling path.

In the component supply device, the positioning guide member is a plate-shaped body disposed between the pair of side wall parts of the guide body to face the upper surface of the tape guide installation area, and both end areas of the width direction in an opposite surface of the upper surface include inclined parts inclined downward toward outward ends as the tape side surface guide parts.

In this aspect, the positioning guide member can be implemented with the simple configuration of disposing the plate-shaped body between the pair of side wall parts of the guide body. This plate-shaped body includes the inclined parts that function as the tape side surface guide parts, and the inclined parts are inclined downward toward the outward ends. Therefore, in the inclined parts, the separation distance between sections that guide the side surfaces of the component storage tape is changed according to the width of the component storage tape. As a result, with the simple configuration of disposing the plate-shaped body between the pair of side wall parts of the guide body, displacement of the component storage tape in the width direction of the tape traveling path is suitably restricted while ensuring good traveling performance of the component storage tape on the tape traveling path.

As described above, the present disclosure can provide the component supply device that can supply components efficiently in the component supply device that supplies components housed in the component storage tape to the component extraction position.

What is claimed is:

1. A component supply device for supplying components to a component extraction position by using a component storage tape including a carrier tape in which a plurality of component storage parts for housing the components are arranged at predetermined intervals, and a cover tape affixed on the carrier tape so as to cover the component storage parts, the component supply device comprising:
a device body;
a tape delivery unit disposed in the device body, the tape delivery unit being configured to deliver the component storage tape toward the component extraction position in a tape feeding direction along an arrangement direction of the component storage parts;

a tape guide attached to the device body, the tape guide being configured to guide traveling of the component storage tape delivered by the tape delivery unit; and a component exposure part configured to expose the components in the component storage parts of the component storage tape traveling by being guided by the tape guide, wherein the tape guide includes:

a guide body including a pair of side walls extending along the tape feeding direction, the pair of side walls being configured to define a tape traveling path with a predetermined width; and a positioning guide including a pair of tape side surface guides attached to the guide body to be disposed on an upstream side in the tape feeding direction with respect to the component exposure part on the tape traveling path, the pair of tape side surface guides being configured to guide side surfaces of the component storage tape, the device body includes a tape guide installation area that is an area to which the tape guide is attached, defines the tape traveling path in cooperation with the pair of side walls of the guide body, and includes an upper surface covered with the guide body from above, the tape guide is attached to the tape guide installation area with displacement allowed in an up and down direction orthogonal to both the tape feeding direction and a width direction of the tape traveling path, displacement of the positioning guide in the up and down direction is allowed together with the guide body following the displacement of the tape guide being allowed in the up and down direction, the pair of tape side surface guides is apart from each other at a distance shorter than a width of the tape traveling path in a width direction, and the pair of tape side surface guides guides the side surfaces of the component storage tape so as to travel toward the component exposure part with positioning performed in the width direction of the tape traveling path, and the pair of tape side surface guides is configured to allow a separation distance between sections that guide the side surfaces to be variable in the width direction.

2. The component supply device according to claim 1, wherein the component exposure part is attached to the tape guide.

3. The component supply device according to claim 1, wherein the positioning guide includes a wire spring.

4. The component supply device according to claim 3, wherein the wire spring has a shape bent in a central portion and includes bent parts in both end areas, cutout parts in which the bent parts are disposed are formed in the pair of side walls of the guide body, and the bent parts function as the tape side surface guides while being disposed in the cutout parts.

5. The component supply device according to claim 1, wherein the positioning guide is a flat body disposed between the pair of side walls of the guide body to face the upper surface of the tape guide installation area, and both end areas of the width direction in an opposite surface of the upper surface include inclined parts inclined downward toward outward ends as the tape side surface guides.

* * * * *